United States Patent

Emoto et al.

[11] Patent Number: 5,908,721
[45] Date of Patent: Jun. 1, 1999

[54] USING LIGHT-SHADING COLORED INK CAPABLE OF CHANGING FROM HYDROPHILIC TO HYDROPHOBIC

[75] Inventors: Kazuhiro Emoto, Tenri; Yoshihiro Izumi, Kashihara; Liyuan Han, Higashiosaka, all of Japan

[73] Assignee: Sharp Kabushiki Kaisha, Osaka, Japan

[21] Appl. No.: 08/797,815

[22] Filed: Feb. 7, 1997

[30] Foreign Application Priority Data

| Feb. 9, 1996 | [JP] | Japan | 8-024485 |
| Mar. 25, 1996 | [JP] | Japan | 8-068802 |
| Mar. 25, 1996 | [JP] | Japan | 8-068803 |
| Mar. 25, 1996 | [JP] | Japan | 8-068804 |
| Mar. 25, 1996 | [JP] | Japan | 8-068806 |

[51] Int. Cl.$^6$ ..................... G03C 1/73
[52] U.S. Cl. ........... 430/7; 430/270.1
[58] Field of Search ............ 430/270.1, 7

[56] References Cited

U.S. PATENT DOCUMENTS

| 4,943,512 | 7/1990 | Kawabata et al. | 430/7 |
| 5,721,076 | 2/1998 | Watanabe et al. | 430/7 |

FOREIGN PATENT DOCUMENTS 0 718 866 A2  6/1996  European Pat. Off. .

*Primary Examiner*—Maria Nuzzolillo
*Assistant Examiner*—Laura Weiner
*Attorney, Agent, or Firm*—David G. Conlin; George W. Neuner

[57] ABSTRACT

The color filter having pixels and a light-shading colored layer on a transparent substrate is provided. The light-shading colored layer is formed from hydrophilic light-shading colored ink, and the hydrophilic light-shading colored ink includes a resin having a monomer unit having a quaternary ammonium salt moiety represented by formula (I):

$$—COO^{\ominus}X^{\oplus} \qquad (I)$$

wherein $X^+$ is represented by formula (II):

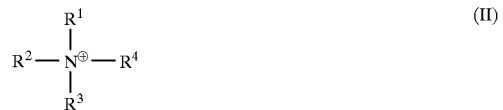

wherein $R^1$, $R^2$, $R^3$, and $R^4$ are independently hydrogen, a substituted or non-substituted linear or branched alkyl group having 1 to 12 carbon atoms, or a substituted or non-substituted linear or branched alkenyl group having 2 to 8 carbon atoms.

23 Claims, 3 Drawing Sheets

USING LIGHT-SHADING COLORED INK CAPABLE OF CHANGING FROM HYDROPHILIC TO HYDROPHOBIC

BACKGROUND OF THE INVENTION

1. Field of the Invention

The present invention relates to a color filter and a method for fabricating the same. More specifically, the present invention relates to an inexpensive color filter with excellent display quality where pixels are flat, and a simple method for fabricating the same. The present invention further relates to an inexpensive liquid crystal display device provided with such a color filter having excellent color display performance.

2. Description of the Related Art

Color filters are an essential component for color display devices such as liquid crystal color display devices. They are fabricated by forming colored pixels on a substrate made of glass or transparent plastic. The colored pixels consist of pixels of three primary colors, red (R), green (G), and blue (B) arranged linearly or in a mosaic fashion. The size of each pixel is about 100 μm. Some methods for forming such colored pixels have been proposed, including: a method where photosensitive R, G, and B colored pastes are applied and patterned with light; an ink jet method where non-photosensitive ink is injected to predetermined positions so as to color the positions; a screen printing method where colored ink is printed on a substrate with a printer, and an electrodeposition method where colored ink is electrodeposited on a substrate with transparent electrodes formed thereon.

In order to enhance the contrast of the pixels, a light-shading colored layer is formed between the pixels (i.e., on a non-pixel portion), forming a so-called black matrix. In TFT-driving type liquid crystal display devices, for example, such a light-shading colored layer is used to shade transistors and wirings. The width of the light-shading colored layer is several micrometers at narrower portions thereof and about 100 μm at wider portions thereof. Such a light-shading colored layer is conventionally formed by etching a chromium film formed by evaporation or sputtering.

The conventional light-shading colored layer has poor ink repellency properties. Colored ink therefore tends into intrude to the light-shading colored layer, thereby preventing the pixels from being formed flat. To overcome this problem, methods for fabricating a color filter by an ink jet method or a printing method where a silicone resin layer is formed on a photosensitive resin layer to utilize the ink repellency of the silicone resin are disclosed, for example, in Japanese Laid-Open Patent Publication Nos. 4-123005, 4-123006, 4-123007, 4-151604, and 4-195102. According to such methods, however, three layers, i.e., the light-shading colored layer, the photosensitive resin layer, and the silicone resin layer need to be formed. Further, a process of developing the photosensitive resin is required. This increases the thickness of the resultant color filter (hence, a liquid crystal display device using the color filter), complicates the fabrication process, and increases the fabrication cost. Thus, a color filter using the conventional light-shading colored layer and the method for fabricating such a color filter have many drawbacks as described above.

SUMMARY OF THE INVENTION

The color filter of this invention includes pixels and a light-shading colored layer on a transparent substrate, wherein the light-shading colored layer is formed from hydrophilic light-shading colored ink, and the hydrophilic light-shading colored ink includes a resin having a monomer unit having a quaternary ammonium salt moiety represented by formula (I):

wherein $X^+$ is represented by formula (II):

wherein $R^1$, $R^2$, $R^3$, and $R^4$ are independently hydrogen, a substituted or non-substituted linear or branched alkyl group having 1 to 12 carbon atoms, or a substituted or non-substituted linear or branched alkenyl group having 2 to 8 carbon atoms.

In one embodiment of the invention, $R^1$, $R^2$, $R^3$, and $R^4$ are independently selected from the group consisting of hydrogen, an alkyl group having 1 to 12 carbon atoms, a hydroxyalkyl group having 1 to 3 carbon atoms, an allyl group, and a methallyl group.

In another embodiment of the invention, one of $R^1$, $R^2$, $R^3$, and $R^4$ is hydrogen and the other three are independently selected from the group consisting of hydrogen, a methyl group, an ethyl group, a propyl group, and a butyl group.

In still another embodiment of the invention, the monomer unit having the quaternary ammonium salt moiety is at least one monomer unit selected from the group consisting of a monomer unit represented by formula (III), a monomer unit represented by formula (IV), a monomer unit represented by formula (V), and a monomer unit represented by formula (VI):

wherein $R^5$ is hydrogen, a methyl group, or a trifluoromethyl group; $R^6$, $R^7$, and $R^8$ are independently selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, a heterocyclic group, a linear or branched fluorine-substituted alkyl group having 1 to 12 carbon atoms, and a fluorine-substituted alkylaryl group.

In still another embodiment of the invention, the resin included in the hydrophilic light-shading colored ink further has a fluorine-containing monomer unit.

In still another embodiment of the invention, the fluorine-containing monomer unit is a monomer unit represented by formula (VII):

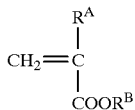
(VII)

wherein $R^A$ is hydrogen, a methyl group, or a trifluoromethyl group, $R^B$ is a linear or branched fluorine-substituted alkyl group having 1 to 22 carbon atoms or a fluorine-substituted alkylaryl group.

In still another embodiment of the invention, the content of the fluorine-containing monomer unit in the resin is in the range of 2 to 90 mol %.

In still another embodiment of the invention, the content of the monomer unit having the quaternary ammonium salt moiety in the resin is in the range of 10 to 70 mol %.

In still another embodiment of the invention, the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

In still another embodiment of the invention, the styrene monomer unit is represented by formula (VIII):

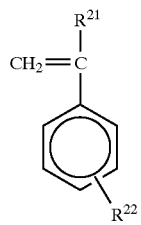
(VIII)

wherein $R^{21}$ is hydrogen or a methyl group, and $R^{22}$ is hydrogen, an alkyl group having 1 to 12 carbon atoms, a nitro group, or a halogen.

In still another embodiment of the invention, the hydrophilic light-shading colored ink further includes a fluorine-containing compound.

In still another embodiment of the invention, the fluorine-containing compound is represented by formula (IX):

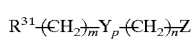
(IX)

wherein $R^{31}$ is a fluorine-substituted alkyl group having 1 to 12 carbon atoms, Y is —COO—, —OCO—, —CONH—, —CO—, —O—, —S—, a phenylene group, —SO$_2$—, —SO$_3$—, or —SO$_2$NH—, Z is —COOH, —OH, —CONH$_2$, —SO$_2$NH$_2$, —NH$_2$, —SO$_3^-$NH$_4^+$, —COO$^-$NH$_4^+$, —COO$^-$NH$^+$(C$_2$H$_5$)$_3$, or —NH$_3^+$.B$^-$ wherein B$^-$ is an anion residue, m and n are independently integers in the range of 0 to 6, and p is 0 or 1.

In still another embodiment of the invention, the hydrophilic light-shading colored ink includes a resin having at least one monomer unit having the quaternary ammonium salt moiety selected from the group consisting of a monomer unit represented by formula (III), a monomer unit represented by formula (IV), and a monomer unit represented by formula (V):

(III)

(IV)

(V)

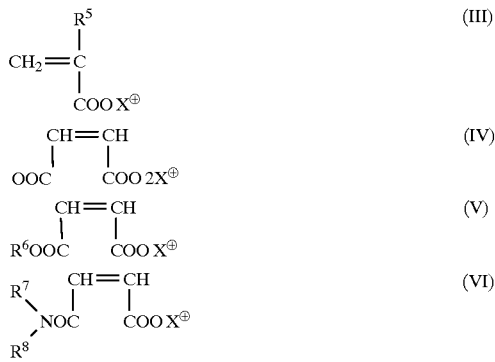
(VI)

wherein $R^5$ is hydrogen or a methyl group; $R^6$ is selected from the group consisting of hydrogen, a substituted or non-substituted linear or branched alkyl group having 1 to 12 carbon atoms, a substituted or non-substituted alkenyl group having 2 to 8 carbon atoms, a substituted or non-substituted aralkyl group, a substituted or non-substituted phenyl group, and a heterocyclic group.

In still another embodiment of the invention, the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

In still another embodiment of the invention, the hydrophilic light-shading colored ink further includes a fluorine-containing compound.

In still another embodiment of the invention, the hydrophilic light-shading colored ink includes a resin having at least one monomer unit having the quaternary ammonium salt moiety selected from the group consisting of a monomer unit represented by formula (III), a monomer unit represented by formula (IV), and a monomer unit represented by formula (V), and a fluorine-containing monomer unit:

(III)

(IV)

(V)

wherein $R^5$ is hydrogen, a methyl group, or a trifluoromethyl group; $R^6$ is selected from the group consisting of hydrogen, a substituted or non-substituted linear or branched alkyl group having 1 to 12 carbon atoms, a substituted or non-substituted alkenyl group having 2 to 8 carbon atoms, a substituted or non-substituted aralkyl group, a substituted or non-substituted phenyl group, and a heterocyclic group.

In still another embodiment of the invention, the content of the fluorine-containing monomer unit in the resin is in the range of 2 to 90 mol %.

In still another embodiment of the invention, the content of the monomer unit having the quaternary ammonium salt moiety in the resin is in the range of 10 to 70 mol %.

In still another embodiment of the invention, the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

In still another embodiment of the invention, the hydrophilic light-shading colored ink further includes a fluorine-containing compound.

In still another embodiment of the invention, the hydrophilic light-shading colored ink includes a resin having at least one monomer unit having the quaternary ammonium salt moiety selected from the group consisting of a monomer unit represented by formula (V) and a monomer unit represented by formula (VI):

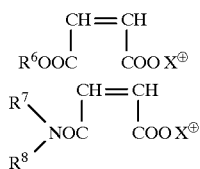

wherein $R^6$ is selected from the group consisting of a linear or branched fluorine-substituted alkyl group having 1 to 12 carbon atoms and a fluorine-substituted alkylaryl group; $R^7$ and $R^8$ are independently selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, a heterocyclic group, a linear or branched fluorine-substituted alkyl group having 1 to 12 carbon atoms, and a fluorine-substituted alkylaryl group, at least one of $R^7$ and $R^8$ being selected from the group consisting of a linear or branched fluorine-substituted alkyl group having 1 to 12 carbon atoms and a fluorine-substituted alkylaryl group.

In still another embodiment of the invention, the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

In still another embodiment of the invention, the hydrophilic light-shading colored ink further includes a fluorine-containing compound.

In still another embodiment of the invention, wherein the hydrophilic light-shading colored ink further includes at least one type of polyamino compound.

In still another embodiment of the invention, the polyamino compound is a diamino compound represented by formula (X):

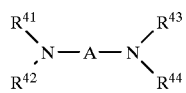

wherein A is a bivalent hydrocarbon residue; and $R^{41}$, $R^{42}$, $R^{43}$, and $R^{44}$ are independently hydrogen, a substituted or non-substituted linear or branched alkyl group having 1 to 12 carbon atoms, a substituted or non-substituted cycloalkyl group having 5 to 6 carbon atoms, or a substituted or non-substituted linear or branched alkenyl group having 2 to 8 carbon atoms.

In still another embodiment of the invention, the light-shading colored layer includes a colorant, and the colorant is a pigment colorant.

In still another embodiment of the invention, the pigment colorant is carbon black having a —COOM group on a surface thereof wherein M is one selected from hydrogen, ammonium, and an alkaline metal.

In still another embodiment of the invention, an underlying layer having an adhesion to the light-shading colored layer is formed on a surface of the transparent substrate.

In still another embodiment of the invention, the underlying layer is made of gelatin.

In still another embodiment of the invention, the underlying layer includes a polymer having a monomer unit represented by formula (XI):

wherein $R^{51}$ is hydrogen or a methyl group; and $R^{52}$ is hydrogen, a substituted or non-substituted linear or branched alkyl group having 1 to 12 carbon atoms, a substituted or non-substituted linear or branched aralkyl group, a substituted or non-substituted phenyl group, or a heterocyclic group.

According to another aspect of the invention, a method for fabricating a color filter is provided. The method includes the steps of: attaching hydrophilic light-shading colored ink to a surface of a transparent substrate in a predetermined pattern; forming a water repellent light-shading colored layer by rendering the hydrophilic light-shading colored ink hydrophobic; and forming pixels by attaching hydrophilic color ink for pixels to portions on the transparent substrate where the water repellent light-shading colored layer is not formed.

In one embodiment of the invention, the hydrophilic light-shading colored ink includes a resin having a monomer unit having a quaternary ammonium salt moiety represented by formula (I):

wherein $X^+$ is represented by formula (II):

wherein $R^1$, $R^2$, $R^3$, and $R^4$ are independently hydrogen, a substituted or non-substituted linear or branched alkyl group having 1 to 12 carbon atoms, or a substituted or non-substituted linear or branched alkenyl group having 2 to 8 carbon atoms.

In another embodiment of the invention, the monomer unit having the quaternary ammonium salt moiety is at least one monomer unit selected from the group consisting of a monomer unit represented by formula (III), a monomer unit represented by formula (IV), a monomer unit represented by formula (V), and a monomer unit represented by formula (VI):

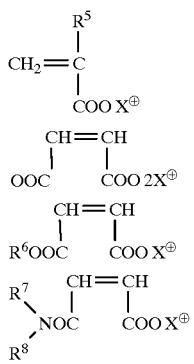

(III)
(IV)
(V)
(VI)

wherein $R^5$ is hydrogen, a methyl group, or a trifluoromethyl group; $R^6$, $R^7$, and $R^8$ are independently selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, a heterocyclic group, a linear or branched fluorine-substituted alkyl group having 1 to 12 carbon atoms, and a fluorine-substituted alkylaryl group.

In still another embodiment of the invention, the hydrophilic light-shading colored ink includes a resin having at least one monomer unit having the quaternary ammonium salt moiety selected from the group consisting of a monomer unit represented by formula (III), a monomer unit represented by formula (IV), and a monomer unit represented by formula (V):

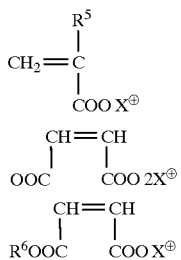

(III)
(IV)
(V)

wherein $R^5$ is hydrogen or a methyl group; $R^6$ is selected from the group consisting of hydrogen, a substituted or non-substituted linear or branched alkyl group having 1 to 12 carbon atoms, a substituted or non-substituted alkenyl group having 2 to 8 carbon atoms, a substituted or non-substituted aralkyl group, a substituted or non-substituted phenyl group, and a heterocyclic group.

In still another embodiment of the invention, the hydrophilic light-shading colored ink includes a resin having at least one monomer unit having the quaternary ammonium salt moiety selected from the group consisting of a monomer unit represented by formula (III), a monomer unit represented by formula (IV), and a monomer unit represented by formula (V), and a fluorine-containing monomer unit:

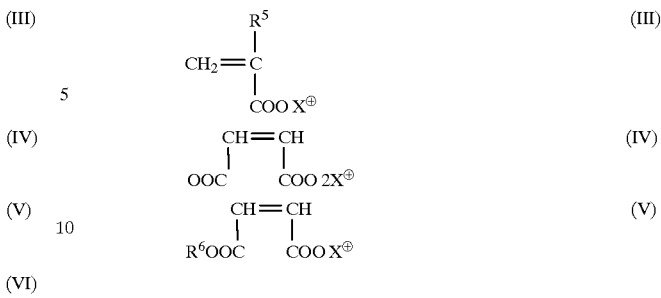

(III)
(IV)
(V)

wherein $R^5$ is hydrogen, a methyl group, or a trifluoromethyl group; $R^6$ is selected from the group consisting of hydrogen, a substituted or non-substituted linear or branched alkyl group having 1 to 12 carbon atoms, a substituted or non-substituted alkenyl group having 2 to 8 carbon atoms, a substituted or non-substituted aralkyl group, a substituted or non-substituted phenyl group, and a heterocyclic group.

In still another embodiment of the invention, the hydrophilic light-shading colored ink includes a resin having at least one monomer unit having the quaternary ammonium salt moiety selected from the group consisting of a monomer unit represented by formula (V) and a monomer unit represented by formula (VI):

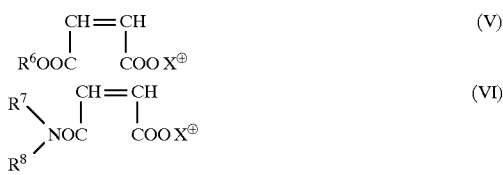

(V)
(VI)

wherein $R^6$ is selected from the group consisting of a linear or branched fluorine-substituted alkyl group having 1 to 12 carbon atoms and a fluorine-substituted alkylaryl group; $R^7$ and $R^8$ are independently selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, a heterocyclic group, a linear or branched fluorine-substituted alkyl group having 1 to 12 carbon atoms, and a fluorine-substituted alkylaryl group, at least one of $R^7$ and $R^8$ being selected from the group consisting of a linear or branched fluorine-substituted alkyl group having 1 to 12 carbon atoms and a fluorine-substituted alkylaryl group.

In still another embodiment of the invention, the light-shading colored layer is formed in accordance with a pattern of non-pixel portions of a liquid crystal display device.

In still another embodiment of the invention, the light-shading colored ink is attached to the transparent substrate by an ink jet method.

In still another embodiment of the invention, the light-shading colored ink is attached to the transparent substrate by a dispenser method.

In still another embodiment of the invention, the light-shading colored ink is attached to the transparent substrate by a stencil printing method.

In still another embodiment of the invention, the light-shading colored ink is attached to the transparent substrate by a screen printing method.

In still another embodiment of the invention, the light-shading colored ink is attached to the transparent substrate by an offset printing method.

In still another embodiment of the invention, the hydrophilic light-shading colored ink further includes at least one type of polyamino compound, and is attached to the transparent substrate by a screen printing method or an offset printing method.

In still another embodiment of the invention, the polyamino compound is a diamino compound represented by formula (X):

wherein A is a bivalent hydrocarbon residue; and $R^{41}$, $R^{42}$, $R^{43}$, and $R^{44}$ are independently hydrogen, a substituted or non-substituted linear or branched alkyl group having 1 to 12 carbon atoms, a substituted or non-substituted cycloalkyl group having 5 to 6 carbon atoms, or a substituted or non-substituted linear or branched alkenyl group having 2 to 8 carbon atoms.

In still another embodiment of the invention, the hydrophilic color ink for pixels is attached to the transparent substrate by an ink jet method.

According to still another aspect of the invention, a liquid crystal display device is provided. The liquid crystal display device includes a pair of substrates sandwiching liquid crystal therebetween, wherein a color filter according to claim 1 is provided on at least one of the pair of substrates.

Thus, the invention described herein makes possible the advantages of (1) providing an inexpensive color filter with excellent display quality where pixels are flat, (2) providing a method for fabricating such a color filter in an easy manner, and (3) providing an inexpensive liquid crystal display device provided with such a color filter where the color display performance is excellent.

These and other advantages of the present invention will become apparent to those skilled in the art upon reading and understanding the following detailed description with reference to the accompanying figures.

DESCRIPTION OF THE PREFERRED EMBODIMENTS

Figure 1:
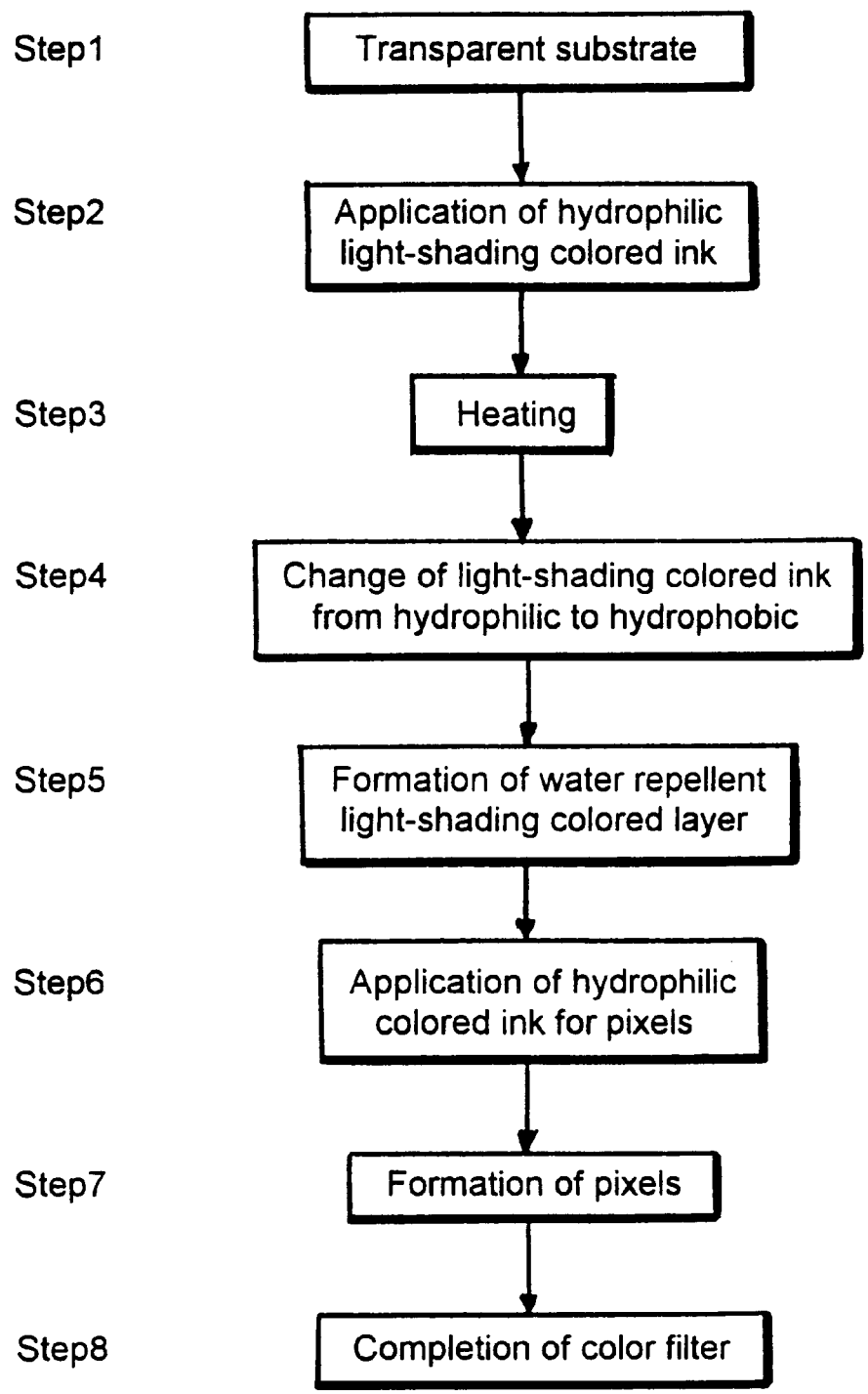
FIG. 1 is a flow chart of a preferred embodiment of the method for fabricating a color filter according to the present invention.

The term "monomer unit" as used herein refers to a repeating unit constituting a resin (i.e., a polymer) included in a light-shading colored ink used for the color filter according to the present invention. The term "quaternary ammonium monomer unit" as used herein refers to a monomer unit having a quaternary ammonium salt moiety. The term "fluorine-containing monomer unit" as used herein refers to a monomer unit which contains fluorine but does not have a quaternary ammonium salt moiety.

The color filter of the present invention includes pixels and a light-shading colored layer formed on a transparent substrate. The light-shading colored layer is formed from hydrophilic light-shading colored ink. After being applied to the substrate, the hydrophilic light-shading colored ink can become hydrophobic by simple processing such as heating, so as to provide a water repellent light-shading colored layer, as will be discussed later in detail.

Hereinbelow, the hydrophilic light-shading colored ink used in the present invention will be described.

A. Quaternary Ammonium Monomer Unit

The hydrophilic light-shading colored ink used for the color filter of the present invention includes a resin having a monomer unit having a quaternary ammonium salt moiety (hereinafter, such a monomer unit is referred to as a quaternary ammonium monomer unit) represented by formula (I) below:

wherein the cation portion $X^+$ of the quaternary ammonium salt moiety is any cation capable of providing ammonia or amine which easily volatizes by heating. Preferably, $X^+$ is represented by formula (II) below:

wherein $R^1$, $R^2$, $R^3$, and $R^4$ are independently hydrogen, a substituted or non-substituted linear or branched alkyl group having 1 to 12, preferably 1 to 6, more preferably 1 to 4 carbon atoms, or a substituted or non-substituted linear or branched alkenyl group having 2 to 8, preferably 3 to 6, more preferably 3 to 4 carbon atoms. The alkyl group or the alkenyl group may be substituted with any substituent as long as the advantages of the present invention are not compromised. Typical examples of such a substituent include a hydroxyl group, a halogen, and an alkoxy group. A hydroxyl group is preferred.

In formula (II), preferably, $R^1$, $R^2$, $R^3$, and $R^4$ are independently selected from the group consisting of hydrogen, an alkyl group having 1 to 12 carbon atoms, a hydroxyalkyl group having 1 to 3 carbon atoms, an allyl group, and a methallyl group. More preferably, $R^1$, $R^2$, $R^3$, and $R^4$ are independently selected from the group consisting of hydrogen, an alkyl group having 1 to 4 carbon atoms, and an allyl group. Especially preferably, one of $R^1$, $R^2$, $R^3$, and $R^4$ is hydrogen, while the other three are independently selected from the group consisting of hydrogen, a methyl group, an ethyl group, a propyl group, and a butyl group. Most preferably, one of $R^1$, $R^2$, $R^3$, and $R^4$ is hydrogen, while the other three are independently selected from the group consisting of hydrogen, a methyl group, and an ethyl group. The cation portion having one of the above structures easily volatilizes by heating, which facilitates rendering the hydrophilic light-shading colored ink hydrophobic.

Specific examples of the cation portion include $NH_4^+$, $NH_3(CH_3)^+$, $NH_2(CH_3)_2^+$, $NH(n-C_3H_7)_3^+$, $NH(CH_3)_3^+$, $N(C_2H_5)_4^+$, $NH(C_2H_5)_3^+$, $NH_2(C_2H_5)_2^+$, $NH_3(C_2H_5)^+$, $NH(C_2H_5)_2(CH_3)^+$, $NH(CH_3)_2(n-C_3H_7)^+$, $NH(CH_3)_2(n-C_4H_9)^+$, $NH(iso-C_3H_7)_3^+$, $NH_3(iso-C_3H_7)^+$, $NH_2(n-C_4H_9)_2^+$, $NH_3(n-C_4H_9)^+$, $NH(CH_2CH=CH_2)_3^+$, $NH_2(CH_2CH=CH_2)_2^+$, $NH(C(CH_3)HCH=CH_2)_3^+$, $NH(CH_2C(CH_3)=CH_2)_3^+$, $NH_3(n-C_6H_{13})^+$, $NH_3(n-C_{12}H_{25})^+$, $NH_3(n-C_8H_{17})^+$, $N(CH_3)_4^+$, $N(CH_3)(C_2H_5)_3^+$, $N(CH_3)_2(C_2H_5)_2^+$, $N(CH_3)_3(CH_2CH=CH_2)^+$, $NH_2(C_2H_4OH)_2{}^+$, $NH_3(C_2H_4OH)^+$, $NH_3(CH_2OH)^+$, $NH_2(CH_2OH)_2{}^+$, $NH(C_2H_4OH)_3{}^+$, and $NH(CH_2OH)_3{}^+$. Among these, $NH_4{}^+$, $NH_3(CH_3)^+$, $NH_2(CH_3)_2{}^+$, $NH(CH_3)_3{}^+$, $NH_3(C_2H_5)^+$, $NH_2(C_2H_5)_2{}^+$, and $NH(C_2H_5)_3{}^+$ are preferred.

When the resin having the quaternary ammonium monomer unit is heated, the cation portion of the quaternary ammonium salt easily volatilizes as ammonia or amine (primary amine, secondary amine, or tertiary amine). As a result, the quaternary ammonium salt is easily converted to a carboxylic acid or a carboxylate. In other words, the resin having the quaternary ammonium monomer unit exhibits good adhesion to a substrate (i.e., good hydrophilicity) during the application to the substrate when the quaternary ammonium salt moiety exists in the resin. After the formation as the light-shading colored layer on the substrate, however, the resin exhibits good water repellency since a hydrophilic moiety (i.e., the salt moiety) has been removed from the resin.

The conversion of the resin from hydrophilic to hydrophobic may occur by the following reaction:

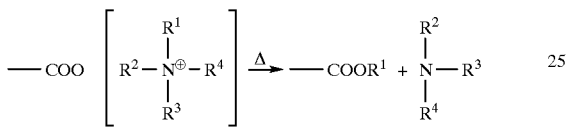

wherein the liberated amine compound is as shown in Table 1 below.

TABLE 1

| $R^2$ | $R^3$ | $R^4$ | Liberated compound |
|---|---|---|---|
| H | H | H | Ammonia |
| not H | H | H | Primary amine |
| not H | not H | H | Secondary amine |
| not H | not H | not H | Tertiary amine |

Specific examples of the liberated amine compound include:

Ammonia;

Primary amines such as methylamine, ethylamine, n-butylamine, n-propylamine, isopropylamine, n-hexylamine, n-stearylamine, n-octylamine, ethanolamine, methanolamine, benzylamine, 4-methylbenzylamine, and 4-chlorobenzylamine;

Secondary amines such as dimethylamine, diethylamine, dimethanolamine, diethanolamine, N-ethyl-N-ethanolamine, dipropylamine, N-methylbenzylamine, diallylamine, dimethallylamine, dibutylamine, and N-methyl-N-ethylamine; and Tertiary amines such as trimethylamine, triethylamine, tripropylamine, N,N-diethylethanolamine, N,N-dimethyl-N-ethylamine, N,N-diethyl-N-methylamine, N,N-dimethyl-N-propylamine, trimethanolamine, triethanolamine, triallylamine, N,N-dimethyl-N-allylamine, trimethallylamine, N,N-diethyl-N-butylamine, and N,N-dimethylbenzylamine.

Accordingly, the cation portion $X^+$ of formula (I) above can be any cation capable of providing ammonia or an amine as listed above and which easily volatizes by heating.

Preferable quaternary ammonium monomer units are represented by formulae (III) to (VI) below:

wherein $R^5$ is hydrogen, a methyl group, or a trifluoromethyl group; $R^6$, $R^7$, and $R^8$ are independently selected from the group consisting of hydrogen, a substituted or non-substituted linear or branched alkyl group having 1 to 12, preferably 1 to 6, more preferably 2 to 4 carbon atoms, a substituted or non-substituted linear or branched alkenyl group having 2 to 8, preferably 3 to 6, more preferably 3 to 4 carbon atoms, a substituted or non-substituted linear or branched aralkyl group, a substituted or non-substituted phenyl group, a heterocyclic group, a linear or branched fluorine-substituted alkyl group having 1 to 12, preferably 1 to 8, more preferably 1 to 4 carbon atoms, and a fluorine-substituted alkylaryl group. The alkyl group, the alkenyl group, aralkyl group, and the phenyl group may be substituted with any substituent as long as the advantages of the present invention are not compromised. Typical examples of such a substituent preferably include a hydroxyl group; a nitro group, a sulfonic acid group, and a halogen. A hydroxyl group is most preferred.

The alkyl group is preferably a methyl group or an ethyl group. The alkenyl group is preferably an allyl group or a methallyl group. The aralkyl group is preferably a benzyl group. The heterocyclic group is preferably a nitrogen-containing five membered ring or an oxygen-containing five membered ring.

The fluorine-substituted alkyl group and the fluorine-substituted alkylaryl group may be perfluoro-substituted or partially fluorine-substituted. The fluorine-substituted alkylaryl group is preferably a phenyl group substituted with fluorine-substituted alkyl group.

The water repellency of the resultant light-shading colored layer may further improve if the quaternary ammonium monomer unit has a fluorine-containing moiety in addition to the quaternary ammonium salt moiety. Examples of such a quaternary ammonium monomer unit having a fluorine-containing moiety include: a quaternary ammonium monomer unit represented by formula (V) above where $R^6$ is selected from the group consisting of a linear or branched fluorine-substituted alkyl group having 1 to 12 carbon atoms and a fluorine-substituted alkylaryl group; and a quaternary ammonium monomer unit represented by formula (VI)

above where at least one of $R^7$ and $R^8$ is selected from the group consisting of a linear or branched fluorine-substituted alkyl group having 1 to 12 carbon atoms and a fluorine-substituted alkylaryl group.

Specific examples of the quaternary ammonium monomer unit having a fluorine-containing moiety include examples E-1 to E-21 below:

(E-1)

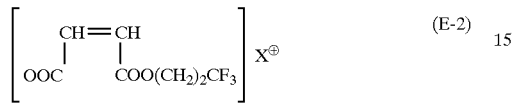
(E-2)

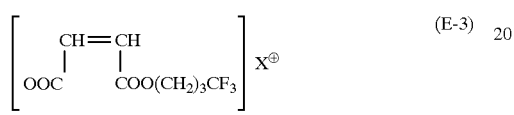
(E-3)

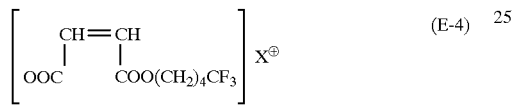
(E-4)

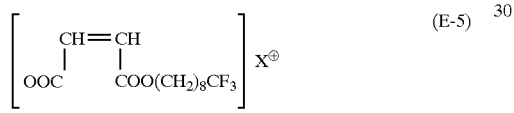
(E-5)

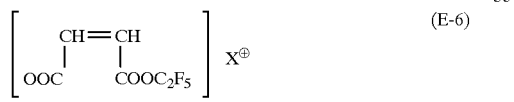
(E-6)

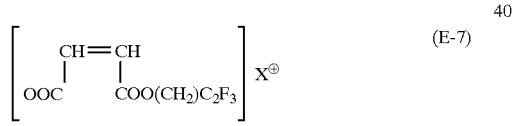
(E-7)

(E-8)

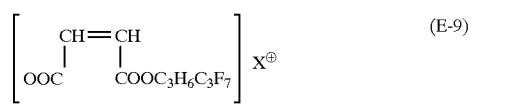
(E-9)

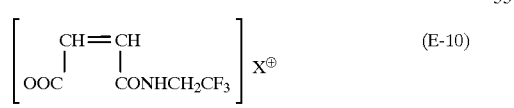
(E-10)

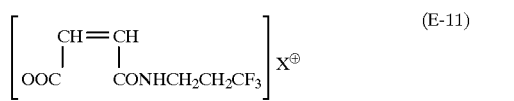
(E-11)

-continued

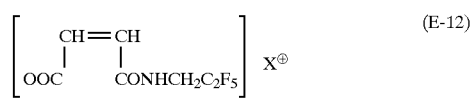
(E-12)

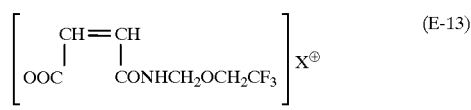
(E-13)

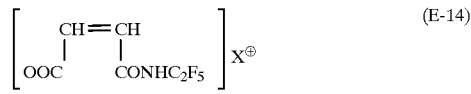
(E-14)

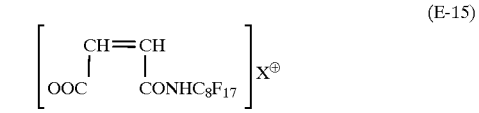
(E-15)

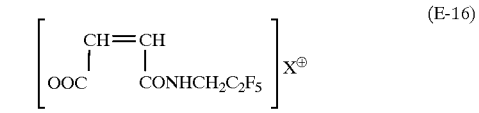
(E-16)

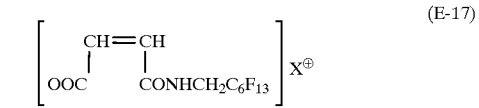
(E-17)

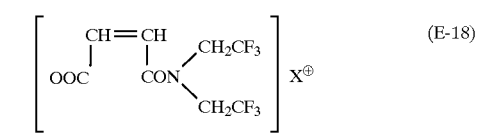
(E-18)

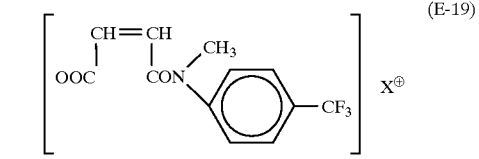
(E-19)

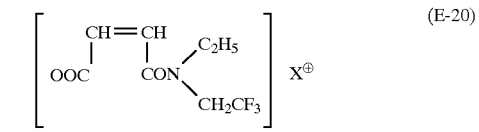
(E-20)

-continued

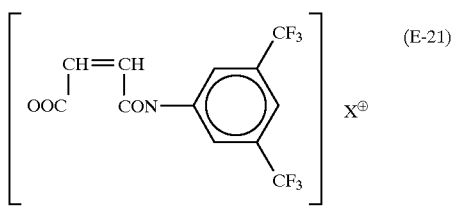

Among the above exemplified monomer units, examples E-6, E-7, E-8, E-14, E-15, and E-18 are preferable because they have excellent water repellency.

The above examples of the quaternary ammonium monomer unit may be used alone or in combination.

B. Fluorine-containing Monomer Unit

Preferably, the resin included in the hydrophilic light-shading colored ink further has a fluorine-containing monomer unit, in addition to the above-described quaternary ammonium monomer unit. With the fluorine-containing monomer unit added in the resin, the water repellency of the resultant light-shading colored layer further improves. In particular, the fluorine-containing monomer unit is preferably added to the resin where the quaternary ammonium monomer unit does not have a fluorine-containing moiety. More specifically, the fluorinecontaining monomer unit is preferably added to the resin where the quaternary ammonium monomer unit represented by formula (III) or (IV) above is used, or where the substituents $R^6$, $R^7$, and $R^8$ in the quaternary ammonium monomer unit represented by formula (V) or (VI) are not a fluorine-containing substituent.

A preferable fluorine-containing monomer unit can be formed from any monomer which is copolymerizable with a monomer capable of forming the quaternary ammonium monomer unit and contains fluorine. Examples of a preferable fluorine-containing monomer unit include a vinylidene fluoride monomer unit, a vinyl fluoride monomer unit, an ethylene trifluoride monomer unit, an ethylene tetrafluoride monomer unit, and a monomer unit represented by formula (VII) below:

wherein $R^A$ is hydrogen, a methyl group, or a trifluoromethyl group, $R^B$ is a linear or branched fluorine-substituted alkyl group having 1 to 22 carbon atoms or a fluorine-substituted alkylaryl group. More preferably, $R^B$ is a linear or branched fluorine-substituted alkyl group having 1 to 18 carbon atoms, especially $\alpha,\alpha,\alpha$-trifluoromethyl group-containing alkyl group (e.g., $CF_3(CH_2)_n$- where n is an integer of 0 to 8).

Preferably, the fluorine-containing monomer unit is a monomer unit represented by formula (VII) above. A monomer capable of forming the fluorine-containing monomer unit represented by formula (VII) can be easily synthesized by reacting, for example, acryloyl chloride (forming a monomer unit where $R^A$ in formula (VII) is hydrogen) or methacryloyl chloride (forming a monomer unit where $R^A$ in formula (VII) is a methyl group) with a fluorine-containing alcohol such as $R^BOH$ (wherein $R^B$ is as defined above) in a solvent (e.g., methylethylketone) by use of a basic catalyst. Some of these compounds are commercially available.

Specific examples of the monomer capable of forming the fluorine-containing monomer unit include 3,3,3-trifluoropropyl acrylate, 3,3,3-trifluoropropyl methacrylate, 2,2,2-trifluoroethyl acrylate, 4,4,4-trifluorobutyl methacrylate, $\alpha,\alpha,\alpha,2,2,2$-hexafluoroethyl methacrylate, $\alpha,\alpha,\alpha,3,3,3$-hexafluoropropyl methacrylate, and 3,3,4,4,4-pentafluorobutyl methacrylate.

The content of the fluorine-containing monomer unit in the resin having the quaternary ammonium monomer unit and the fluorine-containing monomer unit is preferably in the range of about 2 to about 90 mol %, more preferably in the range of about 10 to about 70 mol %, though the content varies depending on the use of the resin. When the content is below about 2 mol %, the water repellency of the resultant light-shading colored layer tends to be insufficient. When the content exceeds about 90 mol %, the adhesion of the light-shading colored ink to the substrate tends to be insufficient.

The content of the quaternary ammonium monomer unit in the resin having the quaternary ammonium monomer unit and the fluorine-containing monomer unit is preferably in the range of about 10 to about 70 mol %, more preferably in the range of about 30 to about 60 mol %, though the content varies depending on the use of the resin. When the content is below about 10 mol %, the adhesion of the light-shading colored ink to the substrate tends to be insufficient. Further, the dispersibility (solubility) in a polar solvent (e.g., water, alcohol, and a mixture thereof) tends to be insufficient, making it difficult to prepare a stable aqueous suspension, i.e., hydrophilic light-shading colored ink. When the content exceeds about 70 mol %, the water repellency of the resultant light-shading colored layer tends to be insufficient.

The above exemplified fluorine-containing monomer units may be used alone or in combination.

C. Comonomer Unit

The resin having the quaternary ammonium monomer unit and optionally the fluorine-containing monomer unit may also have another monomer unit as required (hereinafter, such an additional monomer unit is referred to as a comonomer unit). The comonomer unit may be used in order to further improve the properties of the resin such as the viscosity of the light-shading colored ink, the binder property of the resin, the dispersibility (solubility) of the resin in water or alcohol, the coating property of the light-shading colored layer (e.g., water repellency, blocking resistance, and cracking resistance), and the heat resistance.

As a monomer capable of forming the comonomer unit (hereinafter, such a monomer is referred to as a comonomer), a radical-polymerizable ethylenically unsaturated monomer is generally used. Examples of the ethyldnically unsaturated monomer include acrylate, methacrylate, a styrene derivative, vinyl acetate, and isobutylene. Among these monomers, acrylate, methacrylate and vinyl acetate are preferred because they can provide uniform light-shading ink and a light-shading colored layer with excellent water repellency.

Examples of the acrylate include methyl acrylate, ethyl acrylate, n-butyl acrylate, 2-ethylhexyl acrylate, dimethylaminoethyl acrylate, 2-ethoxy acrylate, t-butyl acrylate, isobutyl acrylate, cyclohexyl acrylate, glycidyl acrylate, 2-hydroxyethyl acrylate, tetrahydrofurfuryl acrylate, n-lauryl acrylate, n-stearyl acrylate, dimethylaminoethyl acrylate, and diethylaminoethyl acrylate. An alkyl acrylate having 1 to 12 carbon atoms is preferred, and an alkyl acrylate having 1 to 8 carbon atoms is more preferred, because they can provide uniform light-shading colored ink and a light-shading colored layer with excellent water repellency.

Examples of the methacrylate include methyl methacrylate, ethyl methacrylate, n-butyl methacrylate, isobutyl methacrylate, 2-hydroxyethyl methacrylate, 2-ethoxy methacrylate, n-octyl methacrylate, n-lauryl methaorylate, glycidyl methacrylate, 2-ethylhexyl methacrylate, t-butyl methacrylate, cyclohexyl methacrylate, n-stearyl methacrylate, tetrahydrofurfuryl methacrylate, diethylaminoethyl methacrylate, and dimethylaminoethyl methacrylate. An alkyl methacrylate having 1 to 12 carbon atoms is preferred, and an alkyl methacrylate having 1 to 8 carbon atoms is more preferred, because they can provide uniform light-shading colored ink and a light-shading colored layer with excellent water repellency.

Preferably, the styrene monomer unit (formed from a styrene derivative) is represented by formula (VIII) below.

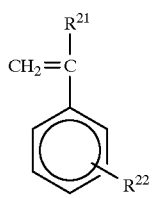

(VIII)

wherein $R^{21}$ is hydrogen or a methyl group, and $R^{22}$ is hydrogen, an alkyl group having 1 to 12 carbon atoms, a nitro group, or a halogen. Examples of the styrene derivative include styrene, α-methylstyrene, x-methylstyrene, x-nitrostyrene (x: meta, para, or ortho), and para-chlorostyrene. Styrene and α-methylstyrene are preferred because they provide a uniform ink composition and a light-shading colored layer with excellent water repellency.

Any monomer other than those listed above, such as a maleic acid diester derivative, may be used as the comonomer. Examples of a maleic acid diester derivative include di(2-ethylhexyl) maleate, diethyl maleate, di(n-butyl) maleate, and dioctyl maleate. Di(2-ethylhexyl) maleate and diethyl maleate are preferred because they provide a uniform ink composition and a light-shading colored layer with excellent water repellency.

The above exemplified comonomer units can be used alone or in combination.

D. Combination of Monomer Units

In a preferred embodiment of the present invention, the hydrophilic light-shading colored ink includes a resin having a monomer unit having at least one quaternary ammonium salt moiety, selected from the group consisting of the monomer unit represented by formula (III) below, the monomer unit represented by formula (IV) below, and the monomer unit represented by formula (V) below:

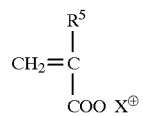

(III)

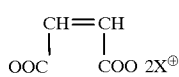

(IV)

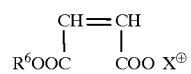

(V)

wherein $R^5$ is hydrogen or a methyl group, $R^6$ is selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, and a heterocyclic group.

In another preferred embodiment of the present invention, the hydrophilic light-shading colored ink includes a resin having a monomer unit having at least one quaternary ammonium salt moiety, selected from the group consisting of the monomer unit represented by formula (III) below, the monomer unit represented by formula (IV) below, and the monomer unit represented by formula (V) below, and a fluorine-containing monomer unit:

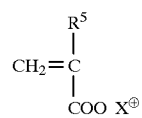

(III)

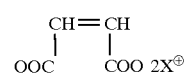

(IV)

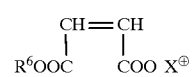

(V)

wherein $R^5$ is hydrogen, a methyl group, or a trifluoromethyl group, $R^6$ is selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, and a heterocyclic group. Preferably, the resin includes 2 to 90 mol % of the fluorine-containing monomer unit and 10 to 70 mol % of the monomer unit containing the quaternary ammonium salt moiety.

In yet another preferred embodiment of the present invention, the hydrophilic light-shading colored ink includes a resin having a monomer unit having at least one quaternary ammonium salt moiety, selected from the group consisting of the monomer unit represented by formula (V) below and the monomer unit represented by formula (VI) below:

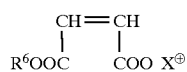

(V)

-continued

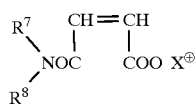

wherein $R^6$ is selected from the group consisting of a linear or branched fluorine-substituted alkyl group having 1 to 12 carbon atoms and a fluorine-substituted alkylaryl group; $R^7$ and $R^8$ are independently selected from the group consisting of hydrogen, a substituted or non-substituted linear or branched alkyl group having 1 to 12 carbon atoms, a substituted or non-substituted linear or branched alkenyl group having 2 to 8 carbon atoms, a substituted or non-substituted aralkyl group, a substituted or non-substituted phenyl group, a heterocyclic group, a linear or branched fluorine-substituted alkyl group having 1 to 12 carbon atoms, and a fluorine-substituted alkylaryl group. At least one of $R^7$ and $R^8$ is selected from the group consisting of a linear or branched fluorine-substituted alkyl group having 1 to 12 carbon atoms and a fluorine-substituted alkylaryl group.

In any of the above preferred embodiments of the present invention, the resin included in the hydrophilic light-shading colored ink may further have at least one type of ethylenically unsaturated monomer unit selected from the group consisting of an acrylate monomer unit, a methacrylate monomer unit, a styrene monomer unit, a vinyl acetate monomer unit, and an isobutylene monomer unit.

When the resin has the above fluorine-containing monomer unit and/or the comonomer unit in combination with the quaternary ammonium monomer unit, the resin can be a copolymer having a plurality of monomer units, or a blend of homopolymers. The resin is preferably in the form of a copolymer because the resultant light-shading colored layer is excellent in uniformity and thus improves in its strength and stability.

E. Preparation of Resin

Hereinbelow, the preparation of the resin having the quaternary ammonium monomer unit to be included in the hydrophilic light-shading colored ink used for the color filter of the present invention will be described.

The resin having the monomer unit having the quaternary ammonium salt moiety represented by formula (I) below:

can be prepared from a monomer capable of forming the quaternary ammonium monomer unit by any appropriate known method. The monomer capable of forming the quaternary ammonium monomer unit may be a carboxyl group-containing monomer. Herein, the carboxyl group-containing monomer is defined to include the monomer containing a carboxyl group and the acid anhydrides thereof. Similarly, a carboxyl group-containing polymer is defined to include the polymer containing a carboxyl group and the acid anhydrides thereof. Examples of the carboxyl group-containing monomer include acrylic acid, methacrylic acid, crotonic acid, maleic acid, and maleic acid monoester.

The resin having the quaternary ammonium monomer unit can be obtained by, for example, polymerizing (or copolymerizing) the carboxyl group-containing monomer and another monomer as required and treating the resultant carboxyl group-containing polymer with ammonia or an amine compound. Alternatively, the resin having the quaternary ammonium monomer unit can be obtained by reacting a carboxyl group-containing monomer with ammonia or amine to form a monomer containing a quaternary ammonium salt moiety and polymerizing the monomer. In general, the former method, i.e., polymerizing a carboxyl group-containing monomer and treating the resultant polymer with ammonia or an amine compound is used. This is because the polymerization in this method is easy, and thus a resin with desired properties (e.g., molecular weight and viscosity) can be easily obtained. According to this method, the carboxyl group-containing polymer obtained in any appropriate manner is dissolved in an appropriate organic solvent with a predetermined concentration, and the resultant solution is mixed with ammonia water or amine (an aqueous amine solution as required). The mixed solution is then agitated while being heated so as to obtain the resin having the quaternary ammonium monomer unit. The heating temperature is preferably in the range of room temperature to about 80° C., more preferably, in the range of about 60° C. to about 80° C., though it may vary depending on the type of ammonia or amine used. The heating time is typically in the range of one hour to several days, though it may vary depending on the heating temperature, the agitation speed and the like.

For example, the quaternary ammonium monomer unit represented by formula (III) below:

(wherein $R^5$ and $X^+$ are as defined above) can be obtained by polymerizing a carboxyl-group-containing monomer such as acrylic acid and methacrylic acid pith another monomer as required and treating the resultant polymer with ammonia or a predetermined amine compound.

The quaternary ammonium monomer units represented by formulae (IV), (V), and (VI) below:

(wherein $R^6$, $R^7$, $R^8$, and $X^+$ are as defined above) can be derived from maleic acid or a derivative thereof. The resin having the quaternary ammonium monomer unit represented by formula (IV) can be obtained, for example, by polymerizing a maleic anhydride with another monomer as required and treating the resultant polymer with ammonia or a predetermined amine compound. The resin having the quaternary ammonium monomer unit represented by formula (V) can be obtained, for example, by polymerizing maleic acid monoester with another monomer as required and treating the resultant polymer with ammonia or a predetermined amine compound. Alternatively, maleic anhydride is polymerized with another monomer as required, and the resultant polymer is reacted with a compound such as $R^6OH$ to partially esterify the polymer, and treated with ammonia or a predetermined amine compound. The latter method is preferred when $R^6$ is a fluorine-containing substituent. The resin having the quaternary ammonium monomer unit represented by formula (VI) can be obtained, for example, by polymerizing a maleic anhydride with another monomer as required, reacting the resultant polymer with $R^7R^8NH$ to partially amidize the polymer, and treating the resultant polymer with ammonia or a predetermined amine compound.

The resin having the fluorine-containing monomer unit and/or the comonomer unit, together with the quaternary ammonium monomer unit, can be obtained by copolymerizing a monomer capable of forming the quaternary ammonium monomer unit together with a monomer capable of forming the fluorine-containing monomer unit and/or a comonomer and treating the resultant copolymer with ammonia or amine as described above, as required. Alternatively, a resin having the quaternary ammonium monomer unit and a resin having the fluorine-containing monomer unit and/or a resin having the comonomer unit may be blended by any appropriate known method.

The monomer capable of forming the fluorinecontaining monomer unit may be a fluorine-containing monomer or a monomer capable of forming the fluorine-containing monomer unit by the treatment after polymerization. For example, the fluorine-containing monomer unit represented by formula (VII) below:

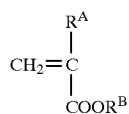

(VII)

(wherein $R^A$ and $R^B$ are as defined above) can also be obtained by polymerizing acrylic acid, methacrylic acid, or the like and esterifying the resultant polymer with a compound such as $R^BOH$.

Examples of preferred combinations of the monomer capable of forming the quaternary ammonium monomer unit and optionally the monomer capable of forming the fluorine-containing monomer unit and/or the comonomer include: styrene and acrylic acid (molar ratio 5:1); n-butyl methacrylate and methacrylic acid (molar ratio 7:1); styrene, ethyl acrylate, and acrylic acid (molar ratio 4:4:1); α-methylstyrene and methacrylic acid (molar ratio 2:1); ethylhexyl methacrylate and methacrylic acid (molar ratio 10:1); cyclohexyl methacrylate and methacrylic acid (molar ratio 2:1); 2-ethoxy acrylate and acrylic acid (molar ratio 1:1); styrene and maleic anhydride (molar ratio 3:1); styrene and monobutyl maleate (molar ratio 2:1); n-butyl acrylate and monoethyl maleate (molar ratio 2:1); styrene and monoethyl maleate (molar ratio 3:1); styrene, maleic anhydride, and n-butyl methacrylate (molar ratio 3:1:1); vinyl acetate and maleic anhydride (molar ratio 3:1); 2-ethylhexyl methacrylate and mono(2-ethylhexyl) maleate (molar ratio 3:1); cyclohexyl methacrylate and monoethyl maleate (molar ratio 3:1); 3,3,3-trifluoropropyl acrylate and acrylic acid (molar ratio 1:10); 3,3,4,4,4-pentafluorobutyl methacrylate, methacrylic acid, and n-butyl methacrylate (molar ratio 4:4:3); α,α,α-trifluoromethyl-2,2,2-trifluoroethyl acrylate, methacrylic acid, and styrene (molar ratio 4:2:4); 3,3,3-trifluoropropyl acrylate and acrylic acid (molar ratio 3:8); 3,3,3-trifluoropropyl acrylate and acrylic acid (molar ratio 5:5); 3,3,3-trifluoropropyl acrylate and acrylic acid (molar ratio 8:3); vinyl acetate, monohexyl inaleate, and 3,3,3-trifluoropropyl acrylate (molar ratio 4:4:2); n-butyl methacrylate, maleic anhydride, and α,α,α,3,3,3-hexafluoropropyl methacrylate (molar ratio 2:4:4); styrene, monoethyl maleate, and 3,3,4,4,4-pentafluorobutyl acrylate (molar ratio 4:5:1); styrene, monoethyl maleate, and 3,3,4,4,4-pentafluorobutyl acrylate (molar ratio 4:4:2); styrene, monoethyl maleate, and 3,3,4,4,4-pentafluorobutyl acrylate (molar ratio 4:2:4); and monobenzyl maleate, and 3,3,3-trifluoropropyl acrylate (molar ratio 4:1).

F. Fluorine-containing Compound

Preferably, the hydrophilic light-shading colored ink further includes any fluorine-containing compound. The fluorine-containing compound is preferably a fluorine type surfactant (i.e., a fluorine-containing surfactant). The fluorine-containing compound is especially useful when ahe resin included in the ink neither has a quaternary ammonium monomer unit having a fluoride-containing moiety nor a fluorine-containing monomer unit. In such a case, the water repellency of the resultant light-shading colored layer is improved by using the fluorine-containing compound. The content of the fluorine-containing compound in the light-shading colored ink is preferably in the range of about 1 to about 30 parts by weight, more preferably in the range of about 1 to about 10 parts by weight, for 100 parts by weight of the ink solid content, though it may vary depending on the identity of the fluorine-containing compound.

A preferred fluorine-containing compound is represented by formula (IX) below:

(IX)

wherein $R^{31}$ is a fluorine-substituted alkyl group having 1 to 12 carbon atoms, Y is —COO—, —OCO—, —CONH—, —CO—, —O—, —S—, a phenylene group, —SO$_2$—, —SO$_3$—, or —SO$_2$NH—, Z is —COOH, —OH, —CONH$_2$, —SO$_2$NH$_2$, —NH$_2$, —SO$_3^-$NH$_4^+$, —COO$^-$NH$_4^+$, —COO$^-$NH$^+$(C$_2$H$_5$)$_3$, or —NH$_3^+$.B$^-$ (B$^-$ is an anion residue), m and n are independently integers in the range of 0 to 6, and p is 0 or 1.

The fluorine-containing compound may be added at the polymerization of the monomer or at any step in the preparation of the light-shading colored ink.

G. Polyamino Compound

Preferably, the hydrophilic light-shading colored ink further includes at least one type of a polyamino compound. Herein, the polyamino compound is defined as a compound having two or more amino groups. The polyamino compound may be a diamino compound, a triamino compound, and the like. The diamino compound is preferred. Such a polyamino compound tends to increase the viscosity of the resultant light-shading colored ink. This is probably because a carboxyl group in the resin included in the light-shading colored ink is ion-crosslinked via the polyamino compound. The carboxyl group in the resin may be derived from the anion portion of the quaternary ammonium monomer unit in the resin, or may be a free carboxyl group which has not formed quaternary ammonium salt. As the viscosity of the ink increases, the ink is markedly prevented from flowing at the application of the ink to a substrate. This is therefore effective when the light-shading colored layer is formed by printing, especially, offset printing and screen printing where the ink viscosity as high as about 1000 cp or more is required in most cases. The ink viscosity has substantially a proportional relationship with the degree of the crosslinking, though the relationship may vary depending on other factors such as the acid value of the resin, the type of the polyamino compound, the type of a colorant which may be included in the ink (a pigment or a dye), and the like. In other words, as the degree of the crosslinking increases, the ink viscosity increases.

Examples of the polyamino compound include ethylenediamine (i,e., 1,2-diaminoethane), m-xylenediamine, p-xylenediamine, p-phenylenediamine, 1,4-diaminobutane, 1,5-diaminopentane, 1,6-diaminohexane, 2,2-dimethyl-1,3-diaminopropane, N,N,N',N'-tetramethyl-1,2-diaminoethane, piperazine, N,N'-diethylpiperazine, 1,4-diaminocyclohexane, 4,4'-diamino-2,2'-disulfostilbene, 1,3-diamino-2-propanol ((H$_2$NCH$_2$)$_2$CHOH), 3,3'-diaminodipropylamine, 2,4-diamino-6-methyl-5-triazine, N,N'-diallyl-1,2-diaminopropane, N,N'-dimethyl-1,2-diaminoethane, 1,3-diamino-cyclopentane, and N,N'-dibutyl-1,2-diaminoethane.

The polyamino compound may be added at the polymerization of the monomer or at any step in the preparation of the light-shading colored ink.

The content of the polyamino compound in the light-shading colored ink is preferably in the range of about 0.1 to about 30 parts by weight, more preferably in the range of about 1 to about 5 parts by weight, for 100 parts by weight of the ink solid content, though it may vary depending on the identity of the polyamino compound. When the content is below about 0.1 parts by weight, the viscosity-improving effect tends to be insufficient. When the content exceeds about 30 parts by weight, gelation of the light-shading colored ink may occur.

Preferably, the ion-crosslinked polyamino compound is liberated and easily volatized by heating after the application of the light-shading colored ink to a substrate.

The ion crosslinking of the resin containing a carboxyl group with the polyamino compound and the liberation of the polyamino compound by heating may occur by the following reaction, for example.

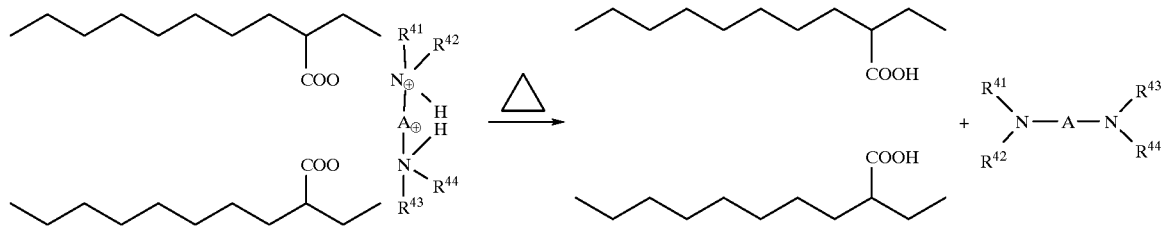

The diamino compound represented by formula (X) below is preferred because it is excellent in improving the viscosity and inexpensive.

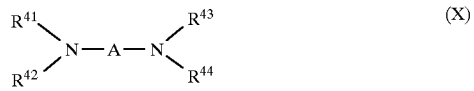

wherein A is a bivalent hydrocarbon residue, and $R^{41}$, $R^{42}$, $R^{43}$, and $R^{44}$ are independently hydrogen, a substituted or non-substituted linear or branched alkyl group having 1 to 12 carbon atoms, a substituted or non-substituted cycloalkyl group having 5 to 6 carbon atoms, or substituted or non-substituted linear or branched alkenyl group having 2 to 8 carbon atoms. The aklyl group is preferably a methyl group or an ethyl group. The alkenyl group is preferably an allyl group or a methallyl group. The alkyl group or the alkenyl group may be substituted with any substituent as long as the advantages of the present invention are not compromised. Typical examples of such a substituent include a hydroxyl group, a halogen, and a methoxy group. A hydroxyl group is preferred.

More preferably, A is a linear alkyl group having 2 to 12 carbon atoms, and $R^{41}$, $R^{42}$, $R^{43}$, and $R^{44}$ are independently hydrogen, a methyl group, or an ethyl group. Especially preferred diamino compounds are ethylenediamine, N,N'-diethylethylenediamine, N,N,N',N'-tetramethylethylenediamine, and N,N,N',N'-tetramethyl-1,3-diaminobutane. These compounds have excellent ion crosslinking properties and high volatilities at heating (as will be described later). The resultant light-shading colored ink therefore becomes hydrophobic from hydrophilic swiftly and easily. Furthermore, such compounds are inexpensive.

As is apparent from the above reaction formula, the polyamino compound may also possess the same function as that possessed by the above-described quaternary ammonium salt moiety in the hydrophilic light-shading colored ink used for the color filter of the present invention. More specifically, the polyamino compound may possess the function of rendering the light-shading colored ink hydrophilic and then rendering the hydrophilic ink hydrophobic by heating. Accordingly, the polyamino compound can be used together with any carboxyl group-containing resin which does not have a quaternary ammonium salt moiety, as well as with the resin having the quaternary ammonium monomer unit, hence forming a light-shading colored ink which becomes hydrophobic from hydrophilic by heating. Herein, the carboxyl group-containing resin is defined to include a resin having the quaternary ammonium monomer unit.

The carboxyl group-containing resin which may be used together with the polyamino compound is not limited, but typically includes a condensation polymerization type resin, a radical polymerization type resin, and an addition polymerization type resin. A resin having a large acid value is preferable in order to enhance the ion crosslinking. The acid value of the carboxyl group-containing resin is preferably 20 or more, more preferably 30 or more. When the acid value is below 20, the ion crosslinking is insufficient. The resultant light-shading colored ink does not have a desired viscosity in many cases. The radical polymerization type resin is preferable because it can have a large acid value relatively easily. The radical polymerization type resin is preferably a copolymer resin having at least one type of monomer unit selected from the group consisting of methacrylic acid, acrylic acid, crotonic acid, maleic anhydride, maleic acid, and maleic acid monoester.

Alternatively, the viscosity of the light-shading colored ink can be adjusted to a desired value, and the solubility of the resin in water, i.e., the hydrophilicity of the resin can be enhanced, by including a monoamino compound in the light-shading colored ink together with the polyamino compound. The monoamino compound can form a quaternary ammonium salt moiety in the carboxyl group-containing resin.

Preferably, the monoamino compound is a compound of which substituents binding to nitrogen are hydrogen, or an alkyl group or a hydroxyalkyl group having 1 to 6 carbon atoms. Especially preferred monoamino compounds are triethylamine, ammonia, n-butylamine, and diethylamine. The light-shading colored ink including one of such monoamino compounds becomes hydrophobic from hydrophilic swiftly and easily.

The content of the monoamino compound in the light-shading colored ink is preferably in the range of about 1 to about 40 parts by weight, more preferably in the range of about 3 to about 30 parts by weight, for 100 parts by weight of the carboxyl group-containing resin.

H. Colorant

The hydrophilic light-shading colored ink includes a colorant (i.e., a light-shading colorant). The light-shading colorant included in the light-shading colored ink may be a pigment or a dye, and may be dissolved or dispersed in the ink. The colorant may be dissolved or dispersed in water, hydrous alcohol, alcohol, hydrous ketone, and the like. The colorant is preferably a black pigment such as carbon black in the consideration of the light-shading. Specific examples of the pigment (organic black pigment) include CI-Acid Black Nos. 1, 2, 3, 24, 26, 30, 31, 33, 48, 50, 60, 110, 112, and 207, and Cl-Direct Black Nos. 5, 7, 19, 22, 51, 62, 112, 117, 118, 122, 154, 159, 169, and 173. Carbon black having a smaller diameter (e.g., in the range of 0.01 to 0.1 μm) is more preferable. The carbon black having a —COOM group on the surface (wherein M is one selected from the group consisting of hydrogen, ammonium, and alkali metals) is preferable. The formation of a —COOM group on the surface can be performed by conventional acid treatment. Such carbon black is excellent in the ink properties (dispersion stability, viscosity, and storage stability), the heat resistance, the oxidation resistance, the blackness, and the blackening.

The content of the colorant in the ink with respect to the resin is preferably 10 parts by weight for about 2 to about 200 parts by weight of the resin when the colorant is of the dispersion type. When the colorant is of the dissolving type, the content of the colorant may be smaller than that when it is of the dispersion type.

I. Preparation of Ink

The light-shading colored ink used for the color filter of the present invention can be prepared by dissolving or dispersing the above-described components in water or an alcoholic solvent. Preferred solvents include water, ethanol, isopropanol, hydrous alcohol, and the like. For example, the light-shading colored ink may be prepared in the following manner. The carboxyl group-containing polymer is added to water or an alcoholic solvent containing an organic solvent such as acetone and methylethylketone as required. To the resultant mixture, ammonia or the amine compound and/or the polyamine compound are added to disperse the polymer. The components such as the colorant and the fluorine-containing compound may be added at any stage of the preparation. The organic solvent such as acetone and methylethylketone contained as required can be removed by vacuum distillation and the like after the dispersion of the components.

J. Substrate

Any known transparent substrate for color filters may be used as the transparent substrate used for the color filter of the present invention. For example, a glass substrate and a plastic substrate are used. The thickness of the transparent substrate is preferably in the range of about 1 to about 3 mm, though it may vary depending on the desired use.

K. Underlying Layer

The transparent substrate may preferably be made hydrophilic. For example, in order to improve the adhesion of the light-shading colored ink to the glass substrate, an underlying layer having good adhesion to the light-shading colored ink may be formed on the substrate. Such an underlying layer is not specifically limited as long as it is a hydrophilic transparent thin film. Examples of the material of the underlying layer include: natural resins such as gelatin and casein; and synthetic resins such as polyvinyl alcohol, partially saponified vinyl acetate resin, polyethylene imine, polyhydroxyethyl methacrylate (e.g., poly(2-hydroxyethyl) methacrylate resin), hydroxyethyl cellulose, polyacrylamide and its derivatives, polymethacrylamide and its derivatives (e.g., methylolled polyacrylamide), and derivatives of aminoalkylalkoxysilane (e.g., (N-trimethoxysilylpropyl) polyethylene). Among the above, gelatin, polyacrylamide and its derivatives, and polymethacrylamide and its derivatives are preferred. These materials may be used alone or in combination.

Polyacrylamide and its derivatives and polymethacrylamide and its derivatives have a monomer unit represented by formula (XI) below:

wherein $R^{51}$ is hydrogen or a methyl group; and $R^{52}$ is hydrogen, a substituted or non-substituted linear or branched alkyl group having 1 to 12, preferably 1 to 8 carbon atoms, a substituted or non-substituted linear or branched aralkyl group, a substituted or non-substituted phenyl group, or a heterocyclic group. The substituted alkyl group is preferably a hydroxyalkyl group. The aralkyl group is preferably a benzyl group. Preferred polyacrylamide, polymethacrylamide, and derivatives thereof are poly(N-methylolacrylamide), poly(N-ethanolacrylamide), poly(N-ethanolmethacrylamide), and the like.

The underlying layer can be formed by applying a solution containing any of the above resins to the substrate and drying. The thickness of the underlying layer is preferably in the range of about 0.5 to about 5.0 μm.

L. Fabrication of Color Filter

Hereinbelow, a preferred embodiment of the method for fabricating a color filter according to the present invention using the above-described hydrophilic light-shading colored ink will be described.

FIG. 1 is a flowchart of a preferred embodiment of the method for fabricating a color filter according to the present invention. First, the above-described hydrophilic light-shading colored ink is applied to predetermined positions on the above-described transparent substrate by a method such as an ink jet method, a screen printing method, an offset printing method, a dispenser method, and a stencil printing method (steps 1 and 2). When the color filter is used for a liquid crystal display device, the light-shading colored layer is preferably formed to match with a pattern of non-pixel portions of the liquid crystal display device.

Then, the light-shading colored ink applied to the transparent substrate is heated (step 3). The light-shading colored ink becomes hydrophobic from hydrophilic by the heating (step 4). The heating temperature is preferably in the range of about 50° C. to about 250° C., more preferably in the range of about 60° C. to about 150° C., most preferably in the range of about 80° C. to about 120° C., though it may vary depending on the type of the resin included in the hydrophilic light-shading colorqd ink. The heating time is preferably in the range of 1 to 30 minutes, more preferably in the range of 5 to 15 minutes, though it may vary depending on the heating temperature and the like.

As described above, the cation portion of the quaternary ammonium salt moiety included in the resin in the light-shading colored ink easily volatilizes as ammonia or amine (primary amine, secondary amine, or tertiary amine) by heating, removing the hydrophilic moiety (i.e., the salt moiety) from the resin, and thus rendering the hydrophilic resin in the light-shading colored ink hydrophobic. Thus, a water repellent light-shading colored layer is formed (step 5).

The thickness of the thus-obtained light-shading colored layer (i.e., the black matrix) is in the range of about 0.8 to about 10 μm, more preferably in the range of about 1.0 to about 5.0 μm. The optical density (OD) is preferably in the range of about 1.5 to about 5.0, more preferably in the range of about 2.0 to about 4.5.

Thereafter, hydrophilic color ink for pixels are applied to the remaining portions on the transparent substrate where the water repellent light-shading colored layer has not been formed (preferably corresponding to pixel portions), thereby forming pixels of the three primary colors, red (R), green (G), and blue (B) (steps 6 and 7). A color filter is thus completed (step 8).

The color ink for pixels is not specifically limited, but any ink generally used for color filters may be used. Such color ink for pixels is typically an aqueous dispersion containing a pigment, a binder resin (e.g., melamine resin), a curing agent, and a surfactant.

The color ink for pixels can be applied to the substrate by a printing method, an ink jet method, and the like. The ink jet method is preferred due to the following reason. The hydrophilic color ink for pixels injected by the ink jet method is more effectively prevented from attaching to the water repellent light-shading colored layer due to the offset effect. This effectively prevents the three colors (R, G, and B) from being mixed with one another, and as a result, markedly improves the precision, the stability, and the easiness in the fabrication of the color filter. The ink jet method is especially preferable in the fabrication of color, filters for large displays which have been realized in recent years.

The color ink for pixels can be applied to the substrate using an ink jet apparatus in the following manner, for example. Minute ink drops are injected from three heads for the three primary colors, R, G, and B, to color the pixel portions on the transparent substrate. Specifically, dye ink may be used to dye a dyeable medium. Alternatively, ink including a resin, a dye or a pigment, and an ink solvent may be injected, and the resin may be cured by heating or light irradiation. When a dyeable medium is dyed with the ink, it is effective to first form a dyeable film on the transparent substrate before the ink repellent (water repellent) light-shading colored layer is formed. In this method of coloring the pixel portions on the transparent substrate, it is important to secure a large contact angle between the light-shading colored layer and the ink injected from the ink jet apparatus. The contact angle includes an advancing contact angle and a receding contact angle as is well known. The receding contact angle is especially important in the present invention. If the contact angle (especially the receding contact angle) is small, ink tends to attach to the light-shading colored layer, varying the amount of ink attaching to the pixel portions, and thereby causing color variation in the resultant color filter. The contact angle (the receding contact angle) is preferably about 20 degrees or more, more preferably about 40 degrees or more.

The large receding contact angle between the light-shading colored layer and the ink is also very effective when the color ink for pixels is applied by a printing method (by a flat type printer using waterless lithography, for example).

As described above, the light-shading colored ink including a polyamino compound to increase the viscosity is suitable for screen printing and offset printing.

Preferably, a top coat may be formed on the color filter fabricated by coloring the pixel portions on the transparent substrate. The top coat is a transparent thin resin film covering the color filter. The material of the top coat and the method for forming the top coat are not specifically limited, but any known material and method may be used. By forming the top coat on the color filter, (1) the color filter is protected from external shock and the like, (2) the flatness of the color filter is improved, and (3) any flow of impurities from the color filter to a liquid crystal layer is prevented when a liquid crystal display device is fabricated using the color filter.

The color filter fabricated in the manner described above has excellent display qualities and flat pixels.

M. Liquid Crystal Display Device

The above color filter is suitably applicable to liquid crystal display devices in general, such as active matrix transmission type liquid crystal display devices, simple multiplex type liquid crystal display devices, and reflection type liquid crystal display devices. The above color filter is further widely applicable to devices using color filters, such as color plasma displays (PDP) and electroluminescent displays (EL).

Hereinbelow, referring to FIGS. 2A and 2B, an active matrix transmission type liquid crystal display device will be described as a preferred example of the application of the color filter.

Figure 2A:
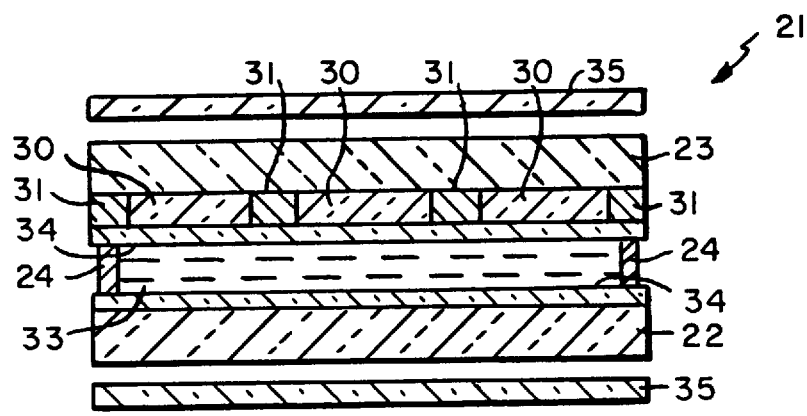
FIGS. 2A and 2B are a schematic sectional view and a perspective view, respectively, of a liquid crystal display panel used for the liquid crystal display device according to the present invention.

FIG. 2A is a schematic sectional view of a liquid crystal display panel 21 used for a liquid crystal display device. FIG. 2D is a perspective view of the liquid crystal display panel 21.

The liquid crystal display panel 21 includes a transparent insulating TFT substrate 22 and a transparent insulating counter substrate 23 which are disposed to face each other with sealing members 24 interposed therebetween. Liquid crystal is contained in a space formed by the two substrates 22 and 23 and the sealing members 24, to form a liquid crystal layer 33 sandwiched by the two substrates 22 and 23.

Pixel electrodes 25 are formed in a matrix on the TFT substrate 22. Signal electrodes (source electrodes) 26 and scanning electrodes (gate electrodes) 27 are also formed on the TFT substrate 22. Thin film transistors (TFTs) 28 are formed near the crossings of the signal electrodes 26 and the scanning electrodes 27. The pixel electrodes 25 are connected to the respective TFTs 28.

A common electrode 29 is formed on the counter substrate 23. R, G, and B color filters 30 are also formed on the counter substrate 23 on the portions corresponding to the pixel electrodes 25, together with a black matrix 31 for separating the pixel portions. The black matrix 31 is formed to prevent light from entering the spaces between the pixel electrodes 25 and the TFT areas.

Alignment films 34 for aligning liquid crystal molecules in a predetermined direction are formed on the surfaces of the TFT substrate 22 and the counter substrate 23 which are in contact with the liquid crystal layer 33. Polarizing plates 35 are provided on the other surfaces (i.e., outer surfaces) of the TFT substrate 22 and the counter substrate 23.

The pixel electrodes 25 include pixel electrodes 25r, 25g, and 25b for displaying red, green, and blue, respectively, disposed in correspondence with the R, G, and B color filters. Each one of the pixel electrodes 25r, 25g, and 25b constitute one pixel set 32.

The pixel set 32 is driven by the TFTs 28 connected to the corresponding pixel electrodes 25. More specifically, the gate of each TFT 28 is connected to the corresponding scanning electrode 27, while each pixel electrode 25 is connected to the corresponding signal electrode 26 via the drain and source of the corresponding TFT 28. In this way, each TFT 28 controls the supply of an image signal to the corresponding pixel electrode 25, to allow the pixel electrode 25 to be driven independently.

In a liquid crystal display device including the liquid crystal display panel 21, the transparency of the liquid crystal varies depending on the image signal supplied to each pixel electrode 25, so that light incident from a backlight (not shown) is modulated at the transmission through the liquid crystal. In such a manner, display of color image Is performed.

Hereinbelow, the function of the present invention will be described.

According to the present invention, the hydrophilic light-shading colored ink constituting the light-shading colored layer includes a resin having a monomer unit having a quaternary ammonium salt moiety. The cation portion of the quaternary ammonium salt moiety in water, an alcoholic solution, or a dispersion (i.e., in the hydrophilic light-shading colored ink) is easily converted to ammonia or amine. (primary amine, secondary amine, or tertiary amine) by normal heating. The ammonia or amine easily volatilizes by heating. Using this property of the ammonium salt moiety, the hydrophilic moiety (i.e., the salt moiety) of the resin in the light-shading colored ink can be easily removed. The resin in the light-shading colored ink therefore easily becomes hydrophobic from hydrophilic by heating. Thus, the light-shading colored ink used for the color filter of the present invention first exhibits good adhesion (hydrophilicity) to the substrate when it is applied to the substrate. By heating the applied ink, a water repellent light-shading colored layer can be easily obtained.

Preferably, the light-shading colored ink includes a fluorine functionality, in addition to the resin having the quaternary ammonium monomer unit. With this fluorine functionality, the water repellency of the resultant light-shading colored layer (black matrix) is greatly enhanced. This effectively prevents R, G, and B color ink for pixels from attaching to the light-shading colored layer, and thereby from mixing with one another. As a result, a color filter with high precision and high stability can be obtained. The fluorine functionality can be introduced into the light-shading colored ink by using, for example, a quaternary ammonium monomer having a fluorine-containing moiety, a fluorine-containing monomer, and/or a fluorine-containing compound, as described above. Especially, in the cases where the fluorine functionality is introduced by a quaternary ammonium monomer having a fluorine-containing moiety and a fluorine-containing monomer, the fluorine functionality exists in each resin molecule. The water repellency of the resultant light-shading colored layer is especially high, compared with the case of simply adding a fluorine-containing compound to the light-shading colored ink. Moreover, troubles associated with bleeding out a fluorine-containing substance with a low molecular weight does not occur, which would otherwise decrease the adhesion of the ink to the substrate. The resin having the fluorine functionality is therefore excellent both in the adhesion of the ink to the substrate and the water repellency of the light-shading colored layer.

The light-shading colored ink may also include a polyamino compound. The viscosity of the ink increases due to ion crosslinking obtained by the addition of the polyamino compound. Such light-shading colored ink is especially suitable for a printing method requiring ink with high viscosity such as screen printing and offset printing.

Thus, according to the present invention, the light-shading colored ink easily becomes hydrophobic from hydrophilic only by normal heating. The resultant light-shading colored ink used for the color filter of the present invention exhibits good adhesion (hydrophilicity) to the substrate when it is applied to the substrate. By heating the applied ink, a water repellent light-shading colored layer can be easily obtained. More specifically, unlike a color filter having a conventional light-shading colored layer, no ink repellent layer made of silicone resin and the like needs to be formed. Moreover, since the light-shading colored ink used in the present invention can be easily patterned by a general printing method, neither photomasking nor development is required, unlike the case of using a conventional photosensitive resin. The patterned light-shading colored ink becomes hydrophobic from hydrophilic without fail with the size and shape of the ink pattern kept unchanged, forming the water repellent light-shading colored layer.

Thus, according to the present invention, (1) the fabrication process can be significantly simplified, (2) the fabrication cost is low, (3) the thickness of the color filter (resultantly, the liquid crystal display device) can be reduced since no ink repellent layer is required in addition to the light-shading colored layer, and (4) with the formation of the pattern of the ink repellent portion with high precision, the pixels of the color filter can be formed with high precision, providing the color filter with excellent display quality.

The color filter of the present invention is suitably applicable to a liquid crystal display device. Such a liquid crystal display device is excellent in the color display and inexpensive.

EXAMPLES

Hereinbelow, the present invention will be described by illustrative but by no means restrictive examples as follows. In these examples, the "parts" and "%" are by weight unless otherwise specified.

First, the preparation of the light-shading colored ink used for the light-shading colored layer of the color filter according to the present invention will be specifically described.

Production Example 1

Ten grams of carbon black (MA-100, manufactured by Mitsubishi Carbon Co. Ltd.) was added to 100 g of a 40% methylethylketone solution of a styrene-acrylic acid copolymer (molar ratio 5:1). This mixture was vibrated with a paint conditioner for 30 minutes, to obtain a dispersion with the carbon black finely dispersed therein. While being agitated, the dispersion was gradually added to a solution with 3.0 g of triethyleamine dissolved in 250 g of pure water. Then, the solution with the dispersion added thereto was heated to 80°

C. to react for about one hour. After completion of the reaction, methylethylketone was removed by vacuum distillation to obtain aqueous dispersion type black ink. The viscosity of the resultant black ink was 400 cp (at 30° C.).

Production Example 2

120 g of a 30% acetone solution of an n-butyl methacrylate-methacrylic acid copolymer (molar ratio 7:1) was gradually added to 200 g of an aqueous solution containing 5 g of CI-Acid Black (No. 26) and 10 cc of 30% ammonia water while being agitated. Then, the mixed solution was heated to 40° C. to react until the scent of ammonia could not be detected. After completion of the reaction, acetone was removed by vacuum distillation to obtain uniform aqueous black ink.

Production Example 3

A denatured azine dye (CI-Direct Black No. 7 analog), 0.6 g, was added to 100 g of a 10% isopropyl alcohol solution of a styrene-ethyl acrylate-acrylic acid copolymer (molar ratio 4:4:1) to obtain a black uniform solution. The black uniform solution was added to a solution with 2.0 g of n-butylamine dissolved in 100 g of isopropyl alcohol and left for three days after sufficient agitation. Then, n-butylamine was removed by vacuum distillation to obtain uniform alcoholic black ink.

Production Examples 4 to 6

In each of the production examples, 100 g of a solution containing the copolymer shown in Table 2 below was added to 50 g of an aqueous solution with 1 g of CI-Acid Black (No. 31) and 2.0 g of diethylamine dissolved therein, and allowed to react until the scent of diethylamine could not be detected. After the reaction, acetone or the like was removed by vacuum distillation to obtain aqueous uniform black ink.

TABLE 2

| | Copolymer resin | Molar ratio | Solvent | Concentration (wt %) |
|---|---|---|---|---|
| Production Example 4 | Ethylhexyl methacrylate-methacrylic acid | 10:1 | Acetone | 40 |
| Production Example 5 | Cyclohexyl methacrylate-methacrylic acid | 2:1 | Methylethylketone | 20 |
| Production Example 6 | 2-ethoxy acrylate-acrylic acid | 1:1 | Tetrahydrofuran | 50 |

Production Example 7

Three grams of acid-treated carbon black (Microzet, manufactured by Orient Chemical Co. Ltd.) was added to 50 g of a 30% n-butyl alcohol solution of an α-methylstyrene-methacrylic acid copolymer (molar ratio 2:1). The mixture was vibrated with a paint conditioner for 30 minutes to obtain a carbon black dispersion. The dispersion was added to 100 g of an aqueous solution with 5 g of monoethanolamine dissolved therein, heated to 80° C., and agitated. While being agitated, the dispersion gradually phase-separated into an oil layer of the n-butyl alcohol and a water layer of the copolymer and the carbon black. After the complete separation of the n-butyl alcohol, n-butyl alcohol was removed to obtain aqueous dispersion type black ink. The viscosity of the resultant black ink was 5300 cp (at 30° C.).

Production Example 8

Eight grams of carbon black (MA-100, manufactured by Mitsubishi Carbon Co. Ltd.) was added to 100 g of a 40% acetone solution of a styrene-monoethyl maleate copolymer (molar ratio 3:1). The mixture was vibrated with a paint conditioner for 30 minutes, to obtain a dispersion with the carbon black finely dispersed therein. While being agitated, the dispersion was gradually added to an aqueous solution of 15 cc of 30% ammonia water and 185 cc of pure water. Then, the mixed solution was heated to 40° C. to 45° C. to react until the scent of ammonia could not be detected. After completion of the reaction, acetone was removed by vacuum distillation to obtain about 200 g of aqueous uniform black ink. The viscosity of the resultant black ink was 4500 cp (at 30° C.).

Production Example 9

Three grams of CI-Acid Black (No. 2) and 4.0 g of monoethanolamine were added to 75 g of a 40% methylethylketone solution of a styrene-maleic anhydride copolymer (molar ratio 2:1), heated to 60° C., and agitated for about one hour. Then, 150 cc of water was added to the mixed solution, and the solution was vibrated with a paint conditioner for about one hour. The phase-separated methylethylketone in the upper layer was removed. The remaining methylethylketone was then removed by vacuum distillation, to obtain about 190 g of aqueous uniform black ink.

Production Example 10

50 g of a 40% tetrahydrofuran solution of a styrene-maleic anhydride-n-butyl methacrylate copolymer (molar rate 3:1:1) was gradually added to 150 g of an aqueous solution containing 2 g of Cl-Acid Black (No. 33) and 10 cc of 30% ammonia water while being agitated. Then, the mixed solution was heated to 40° C. to react until the scent of ammonia could not be detected. Thus, 200 g of uniform black ink in a water/tetrahydrofuran mixed solvent was obtained.

Production Example 11

Three grams of acid-treated carbon black (Microzet, manufactured by Orient Chemical Co. Ltd.) was added to 60 g of a 50% ethanol solution of a vinyl acetate-maleic anhydride copolymer (molar ratio 3:1). The mixture was vibrated with a paint conditioner for 30 minutes, to obtain a carbon black dispersion. The dispersion was added to 140 g of an aqueous solution with 6 g of n-hexylamine dissolved therein, heated to 70° C., and agitated. The solution which had been opaque became transparent and uniform. Thus, 200 g of dispersion type black ink in a water/ethanol mixed solvent was obtained. The viscosity of the resultant black ink was 250 cp (at 30° C.).

Production Example 12

100 g of a 50% n-butyl alcohol solution of a 2-ethylhexyl methacrylate-mono(2-ethylhexyl) maleate copolymer (molar ratio 1:1) was mixed with a solution with 2 g of Amide Black (10B) represented by formula (XII) dissolved in 200 g of water and 10 cc of ammonia water. The mixture was agitated for about two hours at 60° C. to allow to react. As the reaction proceeds, ammonia was converted to quaternary ammonium salt, accompanied by the phase separation of n-butyl alcohol. The phase-separated n-butyl alcohol was removed to obtain 220 g of black ink of an aqueous solution type.

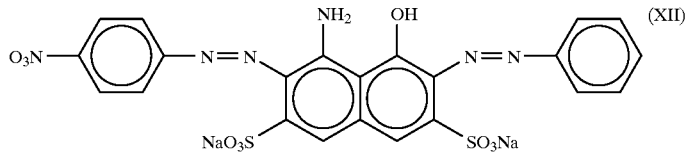

Production Example 13

200 g of a 30% acetone solution of a cyclohexyl methacrylate-monoethyl maleate copolymer (molar ratio 2:1) was mixed with 200 g of an aqueous solution of a denatured azine dye (CI-Direct Black No. 19) represented by formula (XIII) and 7.5 cc of isopropylamine. The mixture was agitated for about two hours at 50° C. Then, acetone was removed by vacuum distillation to obtain 200 g of black ink. The viscosity of the resultant black ink was 5000 cp (at 30° C.).

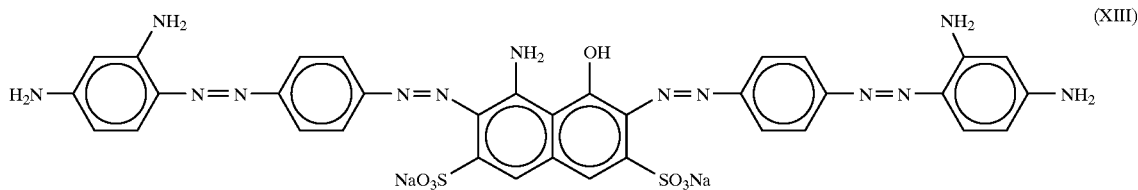

Production Example 14

Three grams of carbon black (MA-100, manufactured by Mitsubishi Carbon Co. Ltd.) was added to 100 g of a 30% acetone solution of a 3,3,3-trifluoropropyl acrylate (represented by formula (XIV); hereinbelow, referred to as TFA)-acrylic acid (hereinafter, referred to as AA) copolymer (molar ratio 1:10). As a viscosity controlling agent, 3 g of glycerin was added.

The mixture was vibrated with a paint conditioner for 30 minutes, to obtain a dispersion with the carbon black finely dispersed therein. At the vibration of the mixture, 30 g of glass beads with a diameter of 2 mm was added to facilitate the dispersion. After the dispersion, the glass beads were removed, and 30 ml of 30% ammonia water was added. The dispersion with the ammonia water added thereto was slowly agitated for a whole day and night at 40° C. to 45° C. The resultant dispersion was gradually added to 100 g of pure water while being agitated. Acetone and ammonia were then removed from the solution by vacuum distillation, to obtain about 140 g of aqueous dispersion type black ink. The viscosity of the resultant black ink was 100 cp (at 30° C.). The same process was also performed without adding carbon black. The resultant solution was uniform and transparent at 30° C.

The results of this production example, together with Production Examples 15 to 17, are shown in Table 3 below.

TABLE 3

| | TFA:AA | 30% ammonia water | Viscosity (CP at 30° C.) | State of solution (at 30° C.) |
|---|---|---|---|---|
| Production Example 14 | 1:10 | 30 g | 100 | Uniform and transparent |
| Production Example 15 | 3:8 | 30 g | 180 | Uniform and transparent |
| Production Example 16 | 5:5 | 20 g | 310 | Uniform and transparent |
| Production Example 17 | 8:3 | 13 g | 740 | Opaque |

Production Examples 15 to 17

The same process as that described in Production Example 14 was performed for each of Production Examples 15 to 17, except that the molar ratio of the TFA:AA copolymer and the amount of ammonia water as shown in Table 3 were used, to obtain aqueous dispersion type black ink. The viscosity of the resultant black ink and the state of the solution obtained without adding carbon black are also shown in Table 3.

Production Example 18

100 g of a 30% tetrahydrofuran solution of a 3,3,4,4,4-pentafluorobutyl methacrylate (represented by formula (XV))-methacrylic acid-n-butyl methacrylate copolymer (molar ratio 4:4:3) was added to 300 g of pure water, and agitated with a homogenizer to obtain an opaque solution.

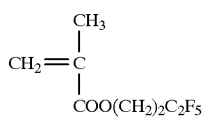

(XV)

The opaque solution was heated to 50° C., and triethylamine was gradually dropped into the solution until the opaque solution became transparent. Total 25 g of triethylamine was added. Then, tetrahydrofuran and excess triethylamine were removed by vacuum distillation, to obtain 315 g of a transparent solution. To the resultant solution was added 0.5 g of urea, 20 g of ethyleneglycol, and 100 g of isopropyl alcohol. Finally, 5 g of CI-Direct Black (No. 19) was added to obtain 340 g of black ink. The viscosity of the resultant black ink was 40 cp (at 30° C.).

Production Example 19

A copolymer of α,α,α-trifluoromethyl-2,2,2-trifluoroethyl acrylate (represented by formula (XVI)), methacrylic acid, and styrene (molar ratio 4:2:4) was obtained by a solution polymerization in methylethylketone under an $N_2$ gas stream using benzoyl peroxide as an initiator.

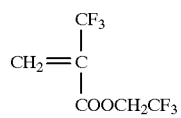

(XVI)

Excess n-butylamine was added to this reaction system, which was then subjected to reflux by heating to allow the reaction system to become opaque. Thereafter, ion-exchanged distilled water was added to the reaction system, and the resultant solution was shaken with a shaker for about 10 minutes, to distribute the copolymer (in which quaternary salt was formed) into the phase-separated water layer. Methylethylketone in the upper layer (oil layer) was removed. The remaining methyl-ethylketone, n-butylamine, and the like were also removed by vacuum distillation, to obtain a dispersion with a solid content of about 5%. Ten parts of diethyleneglycol monoethylester was added to 100 parts of this dispersion, and 20 parts of carbon black (Microzet, manufactured by Orient Chemical Co., Ltd.) of which surface was acid-treated was added to 100 parts of the solid content of the dispersion. The mixture was sufficiently mixed and dispersed with a ball mill, to obtain black ink with a concentration of about 6%. The viscosity of the resultant black ink was 15 cp (at 30°).

Production Comparative Example 1

The same process as that described in Production Example 19 was performed in this production comparative example, except that no n-butylamine was added to obtain black ink with a concentration of about 6%. The viscosity of the resultant black ink was 35 cp (at 30° C.).

Production Example 20

Six grams of carbon black (MA-100, manufactured by Mitsubishi Carbon Co., Ltd.) was added to 100 g of a 50% acetone solution of a vinyl acetate-monohexyl maleate-3,3,3-trifluoropropyl acrylate copolymer (molar ratio 4:4:2). The mixture was vibrated with a paint conditioner for 30 minutes, to obtain a black dispersion with the carbon black finely dispersed therein. The dispersion was gradually added to a solution with 20 ml of 30% ammonia water dissolved in 200 g of ion-exchanged water. The resultant solution was heated to 45° C. to react until the scent of ammonia could not be detected. During this reaction, the opaque solution became transparent.

After completion of the reaction, acetone, ammonia, and the like were removed by vacuum distillation, to obtain 270 g of aqueous dispersion type black ink. The viscosity of the resultant black ink was 150 cp (at 30° C.).

Production Example 21

Two grams of CI-Direct Black (No. 19) was added to 100 g of an methylethylketone solution containing an n-butyl methacrylate-maleic anhydride-α,α,α,3,3,3-hexafluoropropyl methacrylate (represented by formula (XVII)) copolymer (molar ratio 2:4:4). An aqueous diethylamine solution was further added, and the resultant solution was shaken with a shaker (Eight-W, manufactured by Yayoi Co., Ltd.) for a whole day and night at room temperature.

(XVII)

After the shaking, the solution was separated into a water layer and an oil layer. A black solution in the lower layer (water layer) was taken out, the remaining diethylamine was removed by vacuum distillation. A glycerin monoester was added as a viscosity controlling agent, to obtain uniform black ink. The viscosity of the resultant black ink was 8000 cp (at 30° C.).

Production Example 22

A styrene-monoethyl maleate-3,3,4,4,4-pentafluorobutyl acrylate copolymer (molar ratio 4:5:1) was obtained by dispersion polymerization in n-butyl alcohol. The copolymer was treated with triethylamine so as to form quaternary ammonium salt in the copolymer molecule, and the resultant quaternary ammonium salt-containing copolymer was dissolved in n-butyl alcohol. Twenty parts of carbon black (mean diameter: 0.05 μm) of which surface was acid-treated and 2 parts of oxalic acid were added to 100 parts of the copolymer, and the resultant solution was agitated with a homogenizer, to obtain uniform dispersion type black ink. Further, in order to obtain the viscosity of 5000 cp or more, one part of butylal resin (Eslex M, manufactured by Sekisui Chemical Co., Ltd.) was added to 2 parts of the copolymer. The viscosity of the resultant black ink was 6500 cp. The molar ratio of the copolymer, the amount of the added butylal resin, and the viscosity of the resultant black ink are shown in Table 4 below, together with those of Production Examples 23 and 24 to be described later.

TABLE 4

| | Molar ratio of copolymer | Copolymer/ butylal resin | Viscosity (CP) |
|---|---|---|---|
| Production Example 22 | 4:5:1 | 2:1 | 6500 |
| Production Example 23 | 4:4:2 | 1:1 | 7800 |

TABLE 4-continued

|  | Molar ratio of copolymer | Copolymer/ butylal resin | Viscosity (CP) |
|---|---|---|---|
| Production Example 24 | 4:2:4 | 1:1 | 12000 |

(Note 1) The molar ratio of copolymer is that of styrene:monoethyl maleate:3, 3,4,4,4-pentafluorobutyl acrylate.
(Note 2) The polymerization yields of the three copolymers were all substantially 100%.
(Note 3) Azobisisobutyronitrile was used as a polymerization initiator.

Production Examples 23 and 24

The preparation process described in Production Example 22 was performed in each of these preparation examples, except that the copolymer with the molar ratio shown in Table 4 was used and that the butylal resin was added at the ratio shown in Table 4, to obtain black ink. The viscosity of the resultant black ink is also shown in Table 4.

Production Example 25

An aqueous solution, 300 ml, with 30 g of n-butylamine dissolved therein was added to a 50% ethyl acetate solution of a monobenzyl maleate (represented by formula (XVIII))-3,3,3-trifluoropropyl acrylate copolymer (molar ratio 4:1). The solution was shaken with a shaker (Eight-W, manufactured by Yayoi Co., Ltd.) for a whole day and night at room temperature.

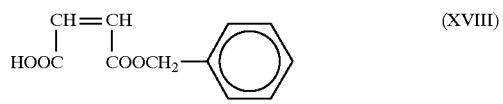

After the shaking, the solution was separated into a water layer and an oil layer. A black solution in the lower layer (water layer) was taken out, and the remaining ethyl acetate and n-butylamine were removed by vacuum distillation. Then, 50 ml of an aqueous solution with 5 g of Cl-Acid Black (10B) dissolved therein was added to the resultant solution, to obtain 410 ml of black ink.

Production Example 26

A styrene-maleic anhydride copolymer (molar ratio 1:1) (SMA 1000A, manufactured by Elef Atchem Co. Ltd.), 100 g, was dissolved in 1 l of dioxane. To this solution was added 80 g of 2,2,2-trifluoroethyl alcohol, and the resultant solution was agitated while being heated in an oil bath (bath temperature: 100° C.) using phosphorus oxychloride as a catalyst under an argon gas atmosphere for about two hours. As a result, 156 g of a partially esterified ternary copolymer represented by formula (XIX) was obtained:

wherein N:M:L=34:100:66. The degree of the esterification was determined based on the amount of the remaining carboxyl group as measured by neutralization titration using phenolphthalein as a indicator.

The resultant ternary copolymer was triturated with n-hexane, and dispersed in ethanol, and quaternary ammonium salt was then formed in the copolymer molecule by the addition of ammonia water. As the reaction proceeded, the solution became transparent and uniform. The solid content of the resultant solution was 35%, and the viscosity thereof was 8600 cp (at 25° C.).

Three grams of carbon black (Microzet, manufactured by Orient Chemical Co., Ltd.) of which surface was acid-treated was added to 60 g of the above solution. The mixture was vibrated with a paint conditioner for 30 minutes, to obtain dispersion type black ink. The viscosity of the resultant black ink was 8600 cp (at 25° C.).

Production Example 27

The same process as that described in Production Example 26 was performed in this production example, except that 0.5 g of ethylenediamine was added to the solution together with the carbon black, to obtain black ink. The viscosity of the resultant black ink was 10200 cp (at 25° C.).

Production Example 28

The same process as that described in Production Example 26 was performed in this production example, except that 2 g of Cl-Acid Black (No. 33) was used in place of 3 g of the carbon black (Microzet) of which surface was acid-treated, to obtain black ink. The viscosity of the resultant black ink was 8600 cp (at 25° C.).

Production Example 29

Fifty grams of a vinyl acetate-maleic anhydride copolymer (molar ratio 1:1) was dissolved in 1 l of dioxane. To this solution was added 18 g of N,N-bis(2,2,2-trifluoroethyl) amine, and the resultant solution was agitated while being heated in an oil bath (bath temperature: 80° C.) under an argon gas atmosphere for about two hours. As a result, 61 g of a partially amidified ternary copolymer represented by formula (XX):

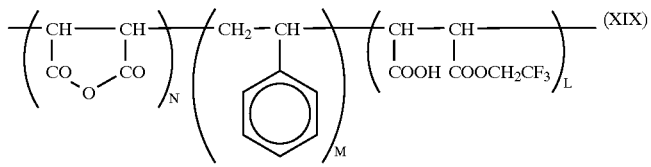

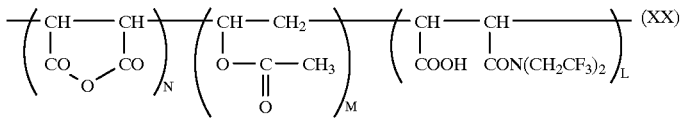 (XX)

wherein N:M:L=5:7:2. The degree of the amidation was determined based on the amount of the remaining carboxyl group as measured by neutralization titration using phenolphthalein as a indicator.

The resultant ternary copolymer was triturated with n-hexane, dispersed in ethanol, and heated at 80° C. for about one hour with the addition of triethylamine, to obtain a uniform solution. The solid content of the resultant solution was 38%, and the viscosity thereof was 14000 cp (at 25° C.).

Three grams of carbon black (Microzet, manufactured by Orient Chemical Co., Ltd.) of which surface was acid-treated was added to 55 g of the above solution. The mixture was vibrated with a paint conditioner for 30 minutes, to obtain dispersion type black ink. The viscosity of the resultant black ink was 14200 cp (at 25° C.).

Production Example 30

CI-Direct Black (No. 19), 1.5 g, was added to 55 g of the solution obtained in Production Example 29. The resultant solution was subjected to ultrasonic processing for about one hour at room temperature to obtain solution type black ink. The viscosity of the resultant black ink was 13000 cp (at 25° C.).

Production Example 31

Eight grams of carbon black (MA-100, manufactured by Mitsubishi Carbon Co., Ltd.) of which surface was treated with nitric acid was added to 100 g of a 40% acetone solution of a styrene-monoethyl maleate copolymer (molar ratio 3:1). The mixture was vibrated with a paint conditioner for 30 minutes, to obtain a dispersion with the carbon black finely dispersed therein. To the dispersion was added 100 g of distilled water with 5 g of ethylenediamine dissolved therein, and agitated while being heated to 60° C. During the agitation, the opaque viscous solution became transparent. Then, acetone and the like were removed by vacuum distillation, to obtain 150 g of dispersion type black ink. The viscosity of the resultant black ink was 15000 cp (at 30° C.).

Production Example 32

The same process as that described in Production Example 31 was performed in this production example, except that 100 g of distilled water with 1 g of ethylenediamine and 4 g of triethylamine dissolved therein was used in place of 100 g of distilled water with 5 g of ethylenediamine dissolved therein to obtain 150 g of dispersion type black ink. The viscosity of the resultant black ink was 8000 cp (at 30° C.).

Production Example 33

100 g of a 30% methylethylketone solution of an n-butyl acrylate-3,3,3-trifluoropropyl acrylate-acrylic acid copolymer (molar ratio 2:2:1) was added to 100 g of distilled water with 3 g of Amide Black (10B) represented by formula (XXI) dissolved therein:

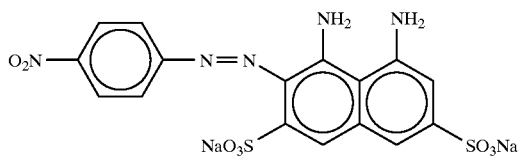 (XXI)

Then, 5 g of 30% ammonia water and 0.6 g of N,N'-diethylethylenediamine were added to the resultant solution. The solution was shaken with a shaker (Eight-W, manufactured by Yayoi Co., Ltd.) for about one hour at 70° C. After the shaking, the solution was separated into a water layer and an oil layer. Methylethylketone in the upper layer (oil layer) was removed, to obtain 141 g of solution-type black ink. The viscosity of the resultant black ink was measured with a R-type viscometer. The measurement results are shown in Table 5 below, together with those in Production Examples 34 to 36 to be described later.

TABLE 5

| | Ammonia water/ N,N'-diethylethylenediamine (g) | Yield of black ink (g) | Viscosity (CP at 30° C.) |
|---|---|---|---|
| Production Example 33 | 5/0.6 | 141 | 6400 |
| Production Example 34 | 5/1.2 | 144 | 8700 |
| Production Example 35 | 5/2.4 | 149 | 12000 |
| Production Example 36 | 5/4.8 | 152 | 17000 |

Production Examples 34 to 36

The same process as that described in Production Example 33 was performed in each of these production examples, except that 30% ammonia water and N,N'-diethylethylenediamine of the amounts shown in Table 5 were used, to obtain black ink. The yield and the viscosity of the resultant black ink in each preparation example are also shown in Table 5. The viscosity of black ink obtained when N,N'-diethylethylenediamine was not added was 680 cp.

Production Example 37

A solution, 100 g, with 5 g of a vinyl acetatecrotonic acid copolymer (molar ratio 1:1) and 5 g of a 2-ethylhexyl methacrylate-mono(2-ethylhexyl) maleate copolymer (molar ratio 3:1) dissolved in n-butyl alcohol was prepared. To the solution was added a solution with 5 g of n-butylamine and 1 g of N,N,N',N'-tetramethylethylenediamine dissolved in 10 g of n-butyl alcohol. The resultant solution was heated at 80° C. for about one hour. The viscosity of the solution significantly increased by this heating. Then, a dispersion with 5 g of a derivative of Direct Black (No. 4) represented by formula (XXII) dispersed in 50 g of n-butyl alcohol was added to the solution, and dispersed with a paint conditioner at room temperature, to obtain 170 g of partially solution-partially dispersion type black ink. The mean diameter of dispersed particles was 0.1 μm. The viscosity of the resultant black ink was 8400 cp (at 30° C.).

(C) Blue ink was prepared by the same process as process (A) except that a blue pigment (PB-15) was used in place of the red pigment (PR177).

The thus-prepared red, green, and blue three types of ink were applied to respective predetermined positions on the glass substrate where the above water repellent light-shading colored layer was not formed using an ink jet apparatus (trial-manufactured by the Sharp kabushiki Kaisha). Thus, red, green, and blue pixels were formed at predetermined

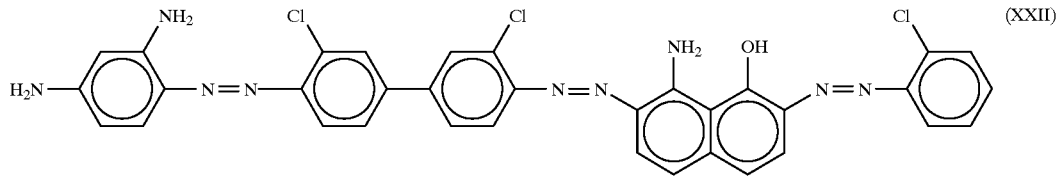

Production Example 38

The same process as that described in Production Example 37 was performed in this production example, except that 1.5 g of N,N,N',N'-tetramethyl-1,3-diaminobutane was used in place of 1 g of N,N,N',N'-tetramethylethylenediamine, to obtain 170 g of black ink. The viscosity of the resultant black ink was 7600 cp (at 30° C.).

Production Example 39

The same process as that described in Production Example 37 was performed in this production example, except that 5 g of diethylamine was used in place of 5 g of n-butylamine, to obtain 170 g of black ink. The viscosity of the resultant black ink was 8900 cp (at 30° C.).

Example 1

A 0.3% ethanol solution of an aminosilane coupling agent (PS076, manufactured by Chisso Corp.) was applied to a 1.2 mm thick glass substrate by dipping, to form a hydrophilic underlying layer with a thickness of 0.2 μm. Then, the light-shading colored ink obtained in Production Example 7 (solid content: 25.0%) was applied to the underlying layer by screen printing, to form a lattice pattern of the light-shading colored ink with a line width of 15 μm and a pitch of 100 μm on the substrate. Immediately after the application of the light-shading colored ink, the opposite side of the glass substrate where the ink was not applied was heated at about 100° C. for about five minutes, to render the hydrophilic light-shading colored ink hydrophobic. The thickness of the thus-formed light-shading colored layer was 2.0 μm and the optical density thereof was 3.1.

Each of red, green, and blue ink (i.e., color ink for pixels) was prepared in the following manner.

(A) Five parts of a red pigment (PR177), 5 parts of a surfactant (Newcall 710F, manufactured by Nippon Nyukazai Co., Ltd.), 10 parts of a melamine resin (Sumitex Resin M-3, manufactured by Sumitomo Chemical Co., Ltd.), one part of a curing agent (Sumitex Accelerator ACX, manufactured by Sumitomo Chemical Co., Ltd.), and 89 parts of water were mixed. The mixture was vibrated with a paint conditioner for one hour at room temperature, to finely disperse the pigment. Thus, red ink was prepared.

(B) Green ink was prepared by the same process as process (A) except that a green pigment (PG-36) was used in place of the red pigment (PR177).

positions on the glass substrate. These pixels were cured at 120° C. for 15 minutes to complete a color filter. The thickness of each pixel after cured was 1.8 μm.

The thus-fabricated color filter was observed with an optical microscope to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 2

A color filter of this example was fabricated by the same method as that described in Example 1 except that the light-shading colored layer was formed by a stencil printing method. The thus-fabricated color filter was observed with an optical microscope as in Example 1 to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 3

Five parts of a fluorine type surfactant represented by formula (XXIII) was added to 100 parts of the resin content of the light-shading colored ink obtained in Production Example 5, and the resultant solution was sufficiently agitated by ultrasonic processing.

$$CF_3COO(CH_2)_2COO^{\ominus}NH_4^{\oplus} \qquad (XXIII)$$

The resultant light-shading colored ink was printed on a glass substrate with an ink jet printer (piezo type) to form a lattice pattern with a line width of 20 μm and a pitch of 100 μm on the substrate. Immediately after the application of the light-shading colored ink to the substrate, the opposite side of the glass substrate where the ink was not applied was heated at about 80° C. for about five minutes, to render the light-shading colored ink hydrophobic from hydrophilic. The thickness of the thus-formed light-shading colored layer was 1.2 μm, and the optical density thereof was 2.3.

The subsequent procedure was the same as that described in Example 1. The thus-fabricated color filter was observed with an optical microscope as in Example 1 to examine whether or not the color ink for pixels had attached to the light-shading colored layer. As a result, no attachment of the color ink for pixels to the light-shading colored layer was observed. Neither color mixture among adjacent pixels nor color difference variation was observed in the color filter. Moreover, the fabrication cost was significantly reduced since no process of development and light exposure of R, G, and B patterns was required in the fabrication of the color filter.

Example 4

Figure 2B:
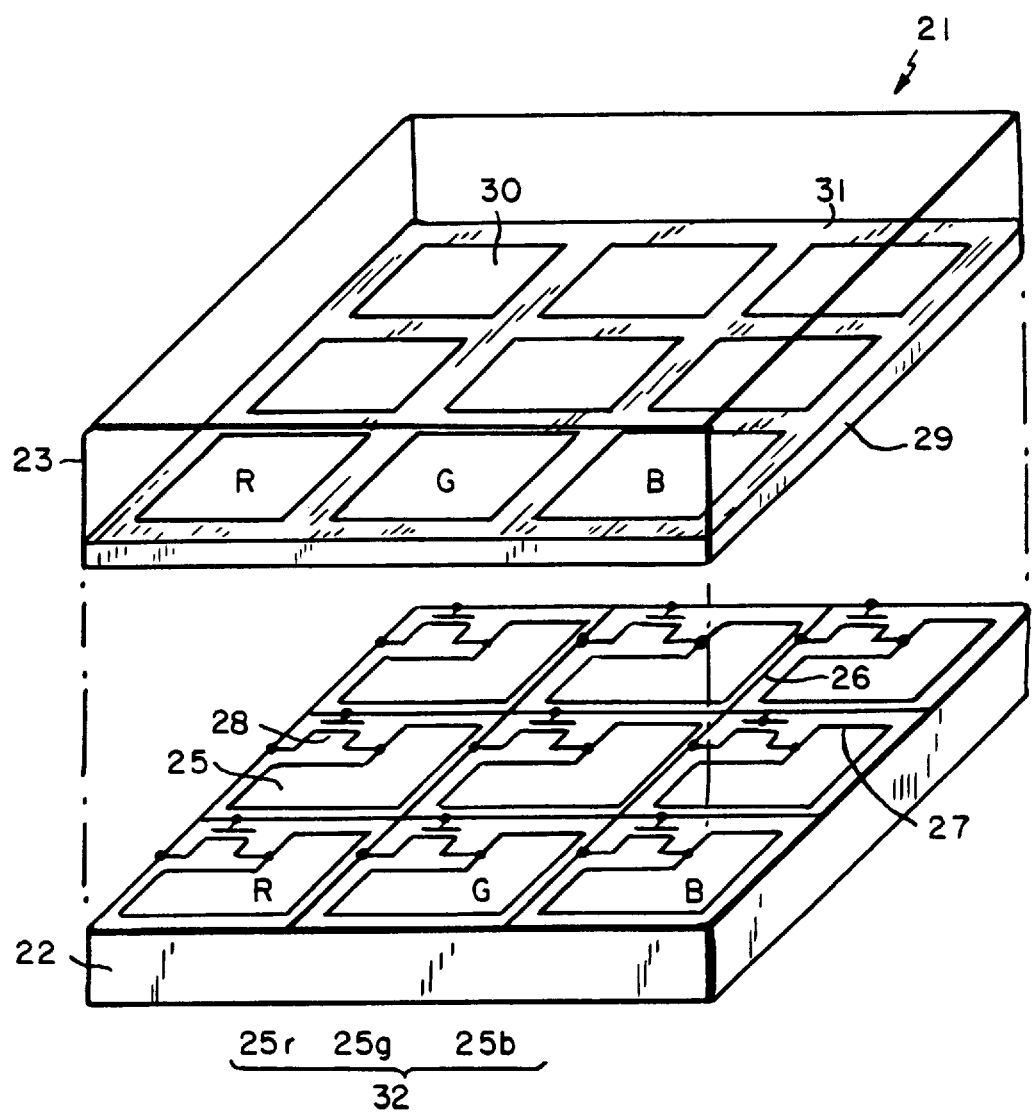
Figure 3:
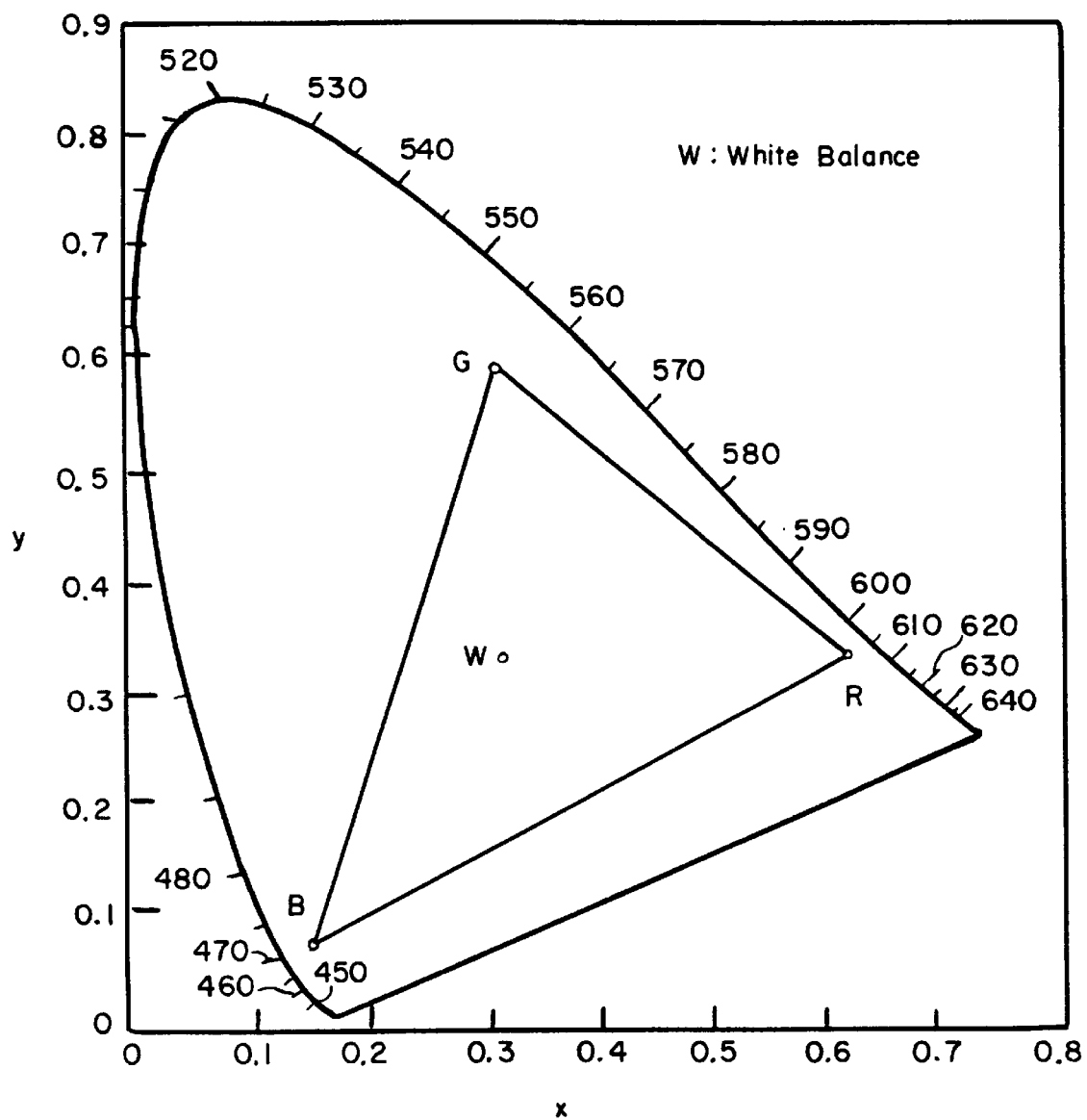
FIG. 3 is a graph showing the color display performance of the liquid crystal display device according to the present invention.

A liquid crystal display device as shown in FIGS. 2A and 2B was fabricated using the color filter fabricated in Example 1. The color display performance of the thus-fabricated liquid crystal display device was measured with a color meter. As a result, it was confirmed that the performance of the liquid crystal display device was satisfactory as shown in FIG. 3, which is enough to be used as a color display device for OA and AV apparatuses. Since the color filter was inexpensive, the liquid crystal display device was fabricated at low cost compared with conventional devices.

Example 5

A liquid crystal display device as shown in FIGS. 2A and 2B was fabricated using the color filter fabricated in Example 3. As in Example 4, the color display performance of the thus-fabricated liquid crystal display device was satisfactory and the fabrication at low cost was possible.

Example 6

A 0.5% ethanol solution of an aminosilane coupling agent (PS076, manufactured by Chisso Corp.) was applied to a 1.2 mm thick glass substrate by dipping, to form a hydrophilic underlying layer with a thickness of 0.3 $\mu$m. Then, a mixture of the light-shading colored ink obtained in Production Example 8 (solid content: 25.0%) and a fluorine type surfactant represented by formula (XXIII) below was applied to the underlying layer by screen printing, to form a lattice pattern of the light-shading colored ink with a line width of 15 $\mu$m and a pitch of 100 $\mu$m on the substrate. The ratio of the fluorine type surfactant in the mixture was 5 parts to 100 parts of the solid content of the light-shading colored ink. Immediately after the application of the light-shading colored ink, the opposite side of the glass substrate where the ink was not applied was heated at about 90° C. until the scent of ammonia could not be detected, to render the hydrophilic light-shading colored ink hydrophobic. The thickness of the thus-formed light-shading colored layer was 2.5 $\mu$m and the optical density thereof was 3.4.

$$CF_3COO(CH_2)_2COO^{\ominus}NH_4^{\oplus} \qquad (XXIII)$$

The subsequent procedure to fabricate the color filter was the same as that described in Example 1.

The thus-fabricated color filter was observed with an optical microscope to examine whether or not the color ink for pixels had attached to the light-shading colored layer. As a result, no attachment of the color ink for pixels to the light-shading colored layer was observed. No color difference variation was observed in the color filter, either. The receding contact angle between the light-shading colored layer and each of the color ink for pixels (R, G, and B) exceeded 25 degrees, which caused no problem. Moreover, the fabrication cost was significantly reduced since no process of development and light exposure of R, G, and B patterns was required in the fabrication of the color filter.

Example 7

A color filter of this example was fabricated by the same method as that described in Example 6 except that the light-shading colored layer was formed by a stencil printing method. The thus-fabricated color filter was observed with an optical microscope as in Example 6 to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 8

A liquid crystal display device as shown in FIGS. 2A and 2B was fabricated using the color filter fabricated in Example 6. The color display performance of the thus-fabricated liquid crystal display device was measured with a color meter. As a result, it was confirmed that the performance of the liquid crystal display device was satisfactory enough to be used as a color display device for OA and AV apparatuses. Since the color filter was inexpensive, the liquid crystal display device was fabricated at low cost compared with conventional devices.

Example 9

A color filter of this example was fabricated by the same method as that described in Example 6 except that the light-shading colored layer was formed with an ink jet printer (piezo type). The thus-fabricated color filter was observed with an optical microscope as in Example 6 to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 10

A liquid crystal display device as shown in FIGS. 2A and 2B was fabricated using the color filter fabricated in Example 9. The color display performance of the thus-fabricated liquid crystal display device was measured with a color meter. As a result, it was confirmed that the performance of the liquid crystal display device was satisfactory enough to be used as a color display device for OA and AV apparatuses. Since the color filter was inexpensive, the liquid crystal display device was fabricated at low cost compared with conventional devices.

Example 11

A 1.0% aqueous solution of an acrylamide-acrylic acid copolymer (molar ratio 4:1) was applied to a 1.2 mm thick glass substrate whose surface had been washed with acetone by dipping, to form a hydrophilic underlying layer with a thickness of 0.2 $\mu$m. A light-shading colored ink (solid content: about 25%) was prepared by adding 0.5 parts of a surfactant represented by formula (XXIV) to 10 parts of the black ink obtained in Production Example 14.

$$CF_3(CH_2)_2COO^{\ominus}NH_4^{\oplus} \qquad \qquad (XXIV)$$

Then, the light-shading colored ink was printed on the underlying layer by a dispenser method, to form a lattice pattern of the light-shading colored ink with a line width of 25 μm and a pitch of 100 μm on the substrate. Immediately after the application of the light-shading colored ink, the opposite side of the glass substrate where the ink was not applied was heated at about 80° C. until the scent of ammonia could not be detected, to render the hydrophilic light-shading colored ink hydrophobic. The thickness d of the thus-formed light-shading colored layer was 1.3 μm and the optical density OD thereof was 2.4. The receding contact angle $\theta_R$ was measured with an automatic contact angle meter (manufactured by Kyowa Kaimen Kagaku Co., Ltd.). The measurement results are shown in Table 6 below, together with those in Examples 12 to 14 to be described layer.

TABLE 6

|  | Ink Used | Thickness of light-shading colored layer d (μm) | Optical density OD | Receding contact angle $\theta_R(°)$ |
|---|---|---|---|---|
| Example 11 | Prod. Ex. 14 | 1.3 | 2.4 | 39 |
| Example 12 | Prod. Ex. 15 | 1.5 | 2.8 | 48 |
| Example 13 | Prod. Ex. 16 | 1.9 | 3.1 | 65 |
| Example 14 | Prod. Ex. 17 | 2.6 | 3.3 | 78 |

Each of red, green, and blue ink (i.e., color ink for pixels) was prepared in the following manner.

(A) Five parts of a red pigment (PR177), 5 parts of a surfactant (Newcall 710F, manufactured by Nippon Nyukazai Co., Ltd.), 10 parts of a melamine resin (Sumitex Resin M-3, manufactured by Sumitomo Chemical Co., Ltd.), one part of a curing agent (Sumitex Accelerator ACX, manufactured by Sumitomo Chemical Co., Ltd.), and 89 parts of water were mixed. The mixture was vibrated with a paint conditioner for one hour at room temperature, to finely disperse the pigment. Thus, red ink was prepared.

(B) Green ink was prepared by the same process as process (A) except that a green pigment (PG-36) was used in place of the red pigment (PR177).

(C) Blue ink was prepared by the same process as process (A) except that a blue pigment (PB-15) was used in place of the red pigment (PR177).

The thus-prepared red, green, and blue three types of ink were applied to respective predetermined positions on the glass substrate where the above water repellent light-shading colored layer was not formed using an ink jet apparatus (trial-manufactured by the Sharp kabushiki Kaisha). Thus, red, green, and blue pixels were formed at predetermined positions on the glass substrate. These pixels were cured at 120° C. for 10 minutes to complete a color filter. The thickness of each pixel after cured was 2.4 μm.

The thus-fabricated color filter was observed with an optical microscope to examine whether or not the color ink for pixels had attached to the light-shading colored layer. As a result, no attachment of the color ink for pixels to the light-shading colored layer was observed. No color difference variation was observed in the color filter, either.

Moreover, the fabrication cost was significantly reduced since no process of development and light exposure of R, G, and B patterns was required in the fabrication of the color filter.

Example 12

A color filter of this example was fabricated by the same method as that described in Example 11 except that the light-shading colored ink was prepared using the black ink obtained in Production Example 15. The thickness d of the light-shading colored layer, the optical density OD, and the receding contact angle $\theta_R$ are shown in Table 6 above.

The thus-fabricated color filter was observed with an optical microscope to examine whether or not the color ink for pixels had attached to the light-shading colored layer, as in Example 11. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 13

A color filter of this example was fabricated by the same method as that described in Example 11 except that the light-shading colored ink was prepared using the black ink obtained in Production Example 16. The thickness d of the light-shading colored layer, the optical density OD, and the receding contact angle $\theta_R$ are shown in Table 6 above.

The thus-fabricated color filter was observed with an optical microscope to examine whether or not the color ink for pixels had attached to the light-shading colored layer, as in Example 11. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 14

A color filter of this example was fabricated by the same method as that described in Example 11 except that the light-shading colored ink was prepared using the black ink obtained in Production Example 17. The thickness d of the light-shading colored layer, the optical density OD, and the receding contact angle $\theta_R$ are shown in Table 6 above.

The thus-fabricated color filter was observed with an optical microscope to examine whether or not the color ink for pixels had attached to the light-shading colored layer, as in Example 11. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Example 15

A 1.0% aqueous solution of gelatin was applied to a 1.5 mm thick glass substrate by dipping at 45° C., to form a hydrophilic underlying layer with a thickness of 0.4 μm. Then, the glass substrate was heated until the surface temperature became 60° C., and the black ink (light-shading colored ink) obtained in Production Example 18 was printed on the underlying layer by an ink jet method, to form a lattice pattern of the light-shading colored layer with a thickness of 1.5 μm, a line width of 35 μm, and a pitch of 100 μm on the substrate. The subsequent procedure to fabricate the color filter was the same as that described in Example 11 except that the thickness of the pixels was 1.4 μm.

The thus-fabricated color filter was observed with an optical microscope to examine whether or not the color ink for pixels had attached to the light-shading colored layer, as in Example 11. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter.

Comparative Example 1

The formation of a light-shading colored layer was attempted in the same manner as that described in Example 15 except that the black ink obtained in Production Comparative Example 1 was used. However, the black ink failed to uniformly apply on the glass substrate, not allowing the formation of a light-shading colored layer.

Example 16

A liquid crystal display device as shown in FIGS. 2A and 2B was fabricated using the color filter fabricated in Example 11. The color display performance of the thus-fabricated liquid crystal display device was measured with a color meter. As a result, it was confirmed that the performance of the liquid crystal display device was satisfactory as shown in FIG. 3, which is enough to be used as a color display device for OA and AV apparatuses. Since the color filter was inexpensive, the liquid crystal display device was fabricated at low cost compared with conventional devices.

Example 17

A liquid crystal display device as shown in FIGS. 2A and 2B was fabricated using the color filter fabricated in Example 15. As in Example 16, the color display performance of the thus-fabricated liquid crystal display device was satisfactory and the fabrication at low cost was possible.

Example 18

A 2% aqueous solution of an acrylamide-acrylic acid copolymer (molar ratio 4:1) was applied to a 1.5 mm thick glass substrate by dipping, to form a hydrophilic underlying layer with a thickness of 0.5 μm. A light-shading colored ink was prepared by adding 0.5 parts of a surfactant represented by formula (XXIII) to 10 parts of the black ink obtained in Production Example 23 and sufficiently agitating by ultrasonic processing.

$$CF_3COO(CH_2)_2COO^\ominus NH_4^\oplus \qquad (XXIII)$$

Then, the light-shading colored ink was printed on the underlying layer by a dispenser method, to form a lattice pattern of the light-shading colored ink with a line width of 20 μm and a pitch of 100 μm on the substrate. Immediately after the application of the light-shading colored ink, the opposite side of the glass substrate where the ink was not applied was heated at about 90° C. until the scent of triethylamine could not be detected, to render the hydrophilic light-shading colored ink hydrophobic. The thickness d of the thus-formed light-shading colored layer was 3.0 μm and the optical density OD thereof was 3.1.

Each of red, green, and blue ink (i.e., color ink for pixels) was prepared as described in Example 11.

The thus-prepared red, green, and blue three types of ink were applied to respective predetermined positions on the glass substrate where the above hydrophobic light-shading colored layer was not formed using an ink jet apparatus (trial-manufactured by the Applicant). Thus, red, green, and blue pixels were formed at predetermined positions on the glass substrate. These pixels were cured at 120° C. for 10 minutes to complete a color filter. The thickness of each pixel after cured was 2.4 μm.

The thus-fabricated color filter was observed with an optical microscope to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter. The receding contact angle between the color ink for pixels and the light-shading colored layer at each pixel exceeded 30 degree.

Example 19

A liquid crystal display device as shown in FIGS. 2A and 2B was fabricated using the color filter fabricated in Example 18. The color display performance of the thus-fabricated liquid crystal display device was measured with a color meter. As a result, it was confirmed that the performance of the liquid crystal display device was satisfactory as shown in FIG. 3, which is enough to be used as a color display device for OA and AV apparatuses. Since the color filter was inexpensive, the liquid crystal display device was fabricated at low cost compared with conventional devices.

Example 20

A formalin-containing gelatin solution was applied to a 1.4 mm thick glass substrate by a squeezing doctor method, and dried by heating at 80° for about 10 minutes, to form a hydrophilic underlying layer with a thickness of 0.8 μm. A light-shading colored ink was prepared by adding 0.5 parts of a fluorine-containing compound represented by formula (XXV) to 10 parts of the black ink obtained in Production Example 27.

$$C_3F_7COO^\ominus NH_4^\oplus \qquad (XXV)$$

Then, the light-shading colored ink was printed on the underlying layer by screen printing, to form a lattice pattern of the light-shading colored ink with a line width of 20 μm and a pitch of 100 μm on the substrate. Immediately after the application of the light-shading colored ink, the opposite side of the glass substrate where the ink was not applied was heated at about 100° C. until the scent of ammonia could not be detected, to render the hydrophilic light-shading colored ink hydrophobic. The thickness of the thus-formed light-shading colored layer was 2.8 μm and the optical density thereof was 3.8.

Each of red, green, and blue ink (i.e., color ink for pixels) was prepared as described in Example 11.

The thus-prepared red, green, and blue three types of ink were applied to respective predetermined positions on the glass substrate where the above hydrophobic light-shading colored layer was not formed using an ink jet apparatus (trial-manufactured by the Applicant). Thus, red, green, and blue pixels were formed at predetermined positions on the glass substrate. These pixels were cured at 120° C. for 10 minutes to complete a color filter. The thickness of each pixel after cured was 2.4 μm.

The thus-fabricated color filter was observed with an optical microscope to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter. The receding contact angle between the color ink for pixels and the light-shading colored layer at each pixel exceeded 25 degree.

Example 21

A liquid crystal display device as shown in FIGS. 2A and 2B was fabricated using the color filter fabricated in Example 20. The color display performance of the thus-fabricated liquid crystal display device was measured with a color meter. As a result, it was confirmed that the performance of the liquid crystal display was satisfactory as shown in FIG. 3, which is enough to be used as a color display device for OA and AV apparatuses. Since the color filter was inexpensive, the liquid crystal display device was fabricated at low cost compared with conventional devices.

Example 22

A 1% ethanol solution of a partially saponificated vinyl acetate resin (degree of saponification: 40%) was applied to a 1.2 mm thick glass substrate by dipping, to form a hydrophilic underlying layer with a thickness of 0.3 μm. A light-shading colored ink was prepared by adding bis (acrylamide) represented by formula (XXVI) to the black ink (solid content: 22%) obtained in Production Example 35.

$$CH_2=CHCONHCH_2CH_2NHCOCH=CH_2 \quad (XXVI)$$

Then, the light-shading colored ink was printed on the underlying layer by screen printing, to form a lattice pattern of the light-shading colored ink with a line width of 20 μm and a pitch of 100 μm on the substrate. Immediately after the application of the light-shading colored ink, the opposite side of the glass substrate where the ink was not applied was heated at about 90° C. until the scent of ethylenediamine could not be detected, to render the hydrophilic light-shading colored ink hydrophobic. The thickness of the thus-formed light-shading colored layer was 3.0 μm and the optical density thereof was 3.2.

Each of red, green, and blue ink (i.e., color ink for pixels) was prepared as described in Example 11.

The thus-prepared red, green, and blue three types of ink were applied to respective predetermined positions where the above hydrophobic light-shading colored layer was not formed using an ink jet apparatus (trial-manufactured by the Applicant). Thus, red, green, and blue pixels were formed at predetermined positions on the glass substrate. These pixels were cured at 120° C. for 10 minutes to complete a color filter. The thickness of each pixel after cured was 2.4 μm.

The thus-fabricated color filter was observed with an optical microscope to examine whether or not the color ink for pixels had attached to the light-shading colored layer. As a result, no attachment of the color ink for pixels to the light-shading colored layer was observed. No color difference variation was observed in the color filter, either. Moreover, the fabrication cost was significantly reduced since no process of development and light exposure of R, G, and B patterns was required in the fabrication of the color filter. The receding contact angle between the color ink for pixels and the light-shading colored layer at each pixel exceeded 25 degree.

Example 23

A liquid crystal display device as shown in FIGS. 2A and 2B was fabricated using the color filter fabricated in Example 22. The color display performance of the thus-fabricated liquid crystal display device was measured with a color meter. As a result, it was confirmed that the performance of the liquid crystal display was satisfactory as shown in FIG. 3, which is enough to be used as a color display device for OA and AV apparatuses. Since the color filter was inexpensive, the liquid crystal display device was fabricated at low cost compared with conventional devices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A color filter having pixels on a transparent substrate and a light-shading colored layer on a non-pixel portion of the transparent substrate, wherein the light-shading colored layer is formed from hydrophilic light-shading colored ink, and the hydrophilic light-shading colored ink includes a resin having at least one monomer unit having a quaternary ammonium salt moiety, the monomer unit being selected from the group consisting of a monomer unit represented by formula (IV), a monomer unit represented by formula (V), and a monomer unit represented by formula (VI):

wherein X$^+$ is represented by formula (II):

wherein R$^1$, R$^2$, R$^3$, and R$^4$ are independently hydrogen, a non-substituted linear or branched alkyl group having 1 to 12 carbon atoms, a non-substituted linear or branched alkenyl group having 2 to 8 carbon atoms, or said alkyl or alkenyl group substituted with at least one substituent selected from the group consisting of a hydroxyl group, a halogen, and an alkoxy group, and wherein R$^6$, R$^7$, and R$^8$ are independently selected from the group consisting of hydrogen, a non-substituted linear or branched alkyl group having 1 to 12 carbon atoms, a non-substituted linear or branched alkenyl group having 2 to 8 carbon atoms, a non-substituted aralkyl group, a non-substituted phenyl group, a heterocyclic group, a linear or branched fluorine-substituted alkyl group having 1 to 12 carbon atoms, and a fluorine-substituted alkylaryl group, provided that each of $R^7$ and $R^8$ may be substituted with a hydroxyl group.

2. A color filter according to claim 1, wherein the resin included in the hydrophilic light-shading colored ink further has a fluorine-containing monomer unit.

3. A color filter according to claim 2, wherein the fluorine-containing monomer unit is a monomer unit represented by formula (VII):

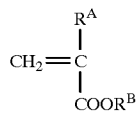

(VII)

wherein $R^A$ is hydrogen, a methyl group, or a trifluoromethyl group, $R^B$ is a linear or branched fluorine-substituted alkyl group having 1 to 22 carbon atoms or a fluorine-substituted alkylaryl group.

4. A color filter according to claim 2, wherein the content of the fluorine-containing monomer unit in the resin is in the range of 2 to 90 mol %.

5. A color filter according to claim 2, wherein the content of the monomer unit having the quaternary ammonium salt moiety in the resin is in the range of 10 to 70 mol %.

6. A color filter according to claim 1, wherein the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

7. A color filter according to claim 6, wherein the styrene monomer unit is represented by formula (VIII):

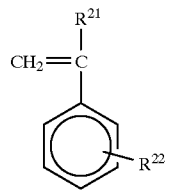

(VIII)

wherein $R^{21}$ is hydrogen or a methyl group, and $R^{22}$ is hydrogen, an alkyl group having 1 to 12 carbon atoms, a nitro group, or a halogen.

8. A color filter according to claim 1, wherein the hydrophilic light-shading colored ink further includes a fluorine-containing compound.

9. A color filter according to claim 8, wherein the fluorine-containing compound is represented by formula (IX):

(IX)

wherein $R^{31}$ is a fluorine-substituted alkyl group having 1 to 12 carbon atoms, Y is —COO—, —OCO—, —CONH—, —CO—, —O—, —S—, a phenylene group, —$SO_2$—, —$SO_3$—, or —$SO_2NH$—, Z is —COOH, —OH, —$CONH_2$, —$SO_2NH_2$, —$NH_2$, —$SO_3^-NH_4^+$, —COO$^-$ $NH_4^+$, —COO$^-$NH$^+$($C_2H_5$)$_3$, or —$NH_3^+$·B$^-$ wherein B$^-$ is an anion residue, m and n are independently integers in the range of 0 to 6, and p is 0 or 1.

10. A color filter according to claim 1, wherein the hydrophilic light-shading colored ink includes a resin having at least one monomer unit having the quaternary ammonium salt moiety selected from the group consisting of a monomer unit represented by formula (IV), and a monomer unit represented by formula (V):

(IV)

(V)

wherein $R^6$ is selected from the group consisting of hydrogen, a non-substituted linear or branched alkyl group having 1 to 12 carbon atoms, a non-substituted linear or branched alkenyl group having 2 to 8 carbon atoms, a non-substituted aralkyl group, a non-substituted phenyl group, and a heterocyclic group.

11. A color filter according to claim 10, wherein the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

12. A color filter according to claim 10, wherein the hydrophilic light-shading colored ink further includes a fluorine-containing compound.

13. A color filter according to claim 1, wherein the hydrophilic light-shading colored ink includes a resin having at least one monomer unit having the quaternary ammonium salt moiety selected from the group consisting of a monomer unit represented by formula (IV), and a monomer unit represented by formula (V), and a fluorine-containing monomer unit:

(IV)

(V)

wherein $R^6$ is selected from the group consisting of hydrogen, a non-substituted linear or branched alkyl group having 1 to 12 carbon atoms, a non-substituted linear or branched alkenyl group having 2 to 8 carbon atoms, a non-substituted aralkyl group, a non-substituted phenyl group, and a heterocyclic group.

14. A color filter according to claim 13, wherein the content of the fluorine-containing monomer unit in the resin is in the range of 2 to 90 mol %.

15. A color filter according to claim 13, wherein the content of the monomer unit having the quaternary ammonium salt moiety in the resin is in the range of 10 to 70 mol %.

16. A color filter according to claim 13, wherein the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

17. A color filter according to claim 13, wherein the hydrophilic light-shading colored ink further includes a fluorine-containing compound.

18. A color filter according to claim 1, wherein the hydrophilic light-shading colored ink includes a resin having at least one monomer unit having the quaternary ammonium salt moiety selected from the group consisting of a monomer unit represented by formula (V) and a monomer unit represented by formula (VI):

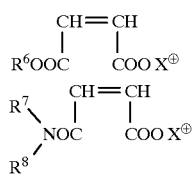

wherein $R^6$ is selected from the group consisting of a linear or branched fluorine-substituted alkyl group having 1 to 12 carbon atoms and a fluorine-substituted alkylaryl group; $R^7$ and $R^8$ are independently selected from the group consisting of hydrogen, a non-substituted linear or branched alkyl group having 1 to 12 carbon atoms, a non-substituted linear or branched alkenyl group having 2 to 8 carbon atoms, a non-substituted aralkyl group, a non-substituted phenyl group, a heterocyclic group, a linear or branched fluorine-substituted alkyl group having 1 to 12 carbon atoms, and a fluorine-substituted alkylaryl group, at least one of $R^7$ and $R^8$ being selected from the group consisting of a linear or branched fluorine-substituted alkyl group having 1 to 12 carbon atoms and a fluorine-substituted alkylaryl group.

19. A color filter according to claim 18, wherein the resin included in the hydrophilic light-shading colored ink further has at least one type of monomer unit selected from the group consisting of an acrylate monomer unit, a methacrylate monomer unit, a styrene monomer unit, a vinyl acetate monomer unit, and an isobutylene monomer unit.

20. A color filter according to claim 18, wherein the hydrophilic light-shading colored ink further includes a fluorine-containing compound.

21. A color filter according to claim 1, wherein the light-shading colored layer includes a colorant, and the colorant is a pigment colorant.

22. A color filter according to claim 21, wherein the pigment colorant is carbon black having a —COOM group on a surface thereof wherein M is one selected from hydrogen, ammonium, or an alkali metal.

23. A color filter having pixels on a transparent substrate and a light-shading colored layer on a non-pixel portion of the transparent substrate, wherein the light-shading colored layer is formed from a hydrophilic light-shading colored ink, and said hydrophilic light-shading colored ink includes:

a resin having a monomer unit represented by formula (IV) and a styrene monomer unit represented by formula (VIII):

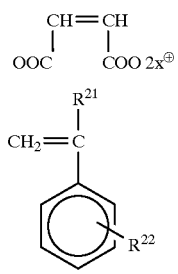

wherein $X^+$ is represented by formula (II):

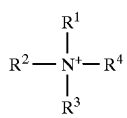

wherein $R^1$, $R^2$, $R^3$, $R^4$ are independently hydrogen, a [substituted or] non-substituted linear or branched alkyl group having 1 to 12 carbon atoms, a non-substituted linear or branched alkenyl group having 2 to 8 carbon atoms, or said alkyl or alkenyl group substituted with at least one substituent selected from the group consisting of a hydroxyl group, a halogen, and an alkoxy group, and wherein $R^{21}$ is hydrogen or a methyl group, and $R^{22}$ is hydrogen, an alkyl group having 1 to 12 carbon atoms, a nitro group, or a halogen.

* * * * *

UNITED STATES PATENT AND TRADEMARK OFFICE

CERTIFICATE OF CORRECTION

PATENT NO.: 5,908,721

DATED: June 1, 1999

INVENTOR(S): Kazuhiro Emoto, Yoshihiro Izumi and Liyuan Han

It is certified that error appears in the above-identified patent and that said Letters Patent is hereby corrected as shown below:

On the title page, and column 1, in the title, correction should read--

[54] COLOR FILTER, USING LIGHT-SHADING COLORED INK CAPABLE OF CHANGING FROM HYDROPHILIC TO HYDROPHOBIC

--.

Signed and Sealed this

Twenty-eighth Day of December, 1999

Attest:

Q. TODD DICKINSON

Attesting Officer

Acting Commissioner of Patents and Trademarks